(12) United States Patent
Ishibashi

(10) Patent No.: US 10,090,189 B2
(45) Date of Patent: Oct. 2, 2018

(54) SUBSTRATE CLEANING APPARATUS COMPRISING A SECOND JET NOZZLE SURROUNDING A FIRST JET NOZZLE

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 553 days.

(21) Appl. No.: 14/541,488

(22) Filed: Nov. 14, 2014

(65) Prior Publication Data

US 2015/0144164 A1   May 28, 2015

(30) Foreign Application Priority Data

Nov. 19, 2013 (JP) ................................ 2013-239040
Nov. 19, 2013 (JP) ................................ 2013-239041
Nov. 22, 2013 (JP) ................................ 2013-241960
Nov. 25, 2013 (JP) ................................ 2013-242716

(51) Int. Cl.
  *H01L 21/67* (2006.01)
  *H01L 21/68* (2006.01)
  *H01L 21/687* (2006.01)

(52) U.S. Cl.
  CPC .. *H01L 21/68792* (2013.01); *H01L 21/67051* (2013.01)

(58) Field of Classification Search
  None
  See application file for complete search history.

(56) References Cited

U.S. PATENT DOCUMENTS

| 5,918,817 | A | * | 7/1999 | Kanno | B05B 7/0433 |
| | | | | | 239/423 |
| 6,543,080 | B1 | | 4/2003 | Tomita et al. | |
| 7,891,314 | B2 | * | 2/2011 | Pichler | B05B 7/0416 |
| | | | | | 118/300 |
| 8,037,891 | B2 | * | 10/2011 | Kanno | B01F 3/04049 |
| | | | | | 134/144 |
| 2007/0169793 | A1 | | 7/2007 | Shimada et al. | |

(Continued)

FOREIGN PATENT DOCUMENTS

| JP | S50-6362 B1 | 3/1975 |
| JP | S58-130532 A | 8/1983 |

(Continued)

OTHER PUBLICATIONS

English Translation of Japanese Office action issued in Patent Application No. JP 2013-239040 dated Aug. 17, 2017.

(Continued)

*Primary Examiner* — Michael E Barr
*Assistant Examiner* — Rita P Adhlakha
(74) *Attorney, Agent, or Firm* — Pearne & Gordon LLP

(57) ABSTRACT

A substrate cleaning apparatus capable of removing particles that exist in minute recesses formed on a substrate surface is disclosed. The substrate cleaning apparatus includes a substrate holder configured to hold a substrate; and a two-fluid nozzle configured to deliver a two-fluid jet onto a surface of the substrate. The two-fluid nozzle includes a first jet nozzle configured to emit a first two-fluid jet and a second jet nozzle configured to emit a second two-fluid jet at a velocity higher than a velocity of the first two-fluid jet, and the second jet nozzle surrounds the first jet nozzle.

25 Claims, 40 Drawing Sheets

(56) References Cited

U.S. PATENT DOCUMENTS

| | | | |
|---|---|---|---|
| 2007/0235062 A1 | 10/2007 | Fujiwara et al. | |
| 2008/0048056 A1 | 2/2008 | Pichler | |
| 2008/0173327 A1 | 7/2008 | Miyagi | |
| 2012/0227770 A1 | 9/2012 | Kaneko et al. | |
| 2013/0220368 A1 | 8/2013 | Ishibashi | |
| 2013/0224956 A1* | 8/2013 | Negoro | H01L 21/31111 438/697 |

FOREIGN PATENT DOCUMENTS

| | | |
|---|---|---|
| JP | S60-261582 A | 12/1985 |
| JP | S61-192379 A | 8/1986 |
| JP | H08-318181 A | 12/1996 |
| JP | H10-156229 A | 6/1998 |
| JP | 11-058226 A | 3/1999 |
| JP | 2000-157939 A | 6/2000 |
| JP | 2001-053047 A | 2/2001 |
| JP | 2003-017452 A | 1/2003 |
| JP | 2003-031540 A | 1/2003 |
| JP | 2004-096023 A | 3/2004 |
| JP | 2005-012197 A | 1/2005 |
| JP | 2005-066572 A | 3/2005 |
| JP | 2005-093873 A | 4/2005 |
| JP | 2005-288394 A | 10/2005 |
| JP | 2007-027241 A | 2/2007 |
| JP | 2007-027270 A | 2/2007 |
| JP | 2007-073610 A | 3/2007 |
| JP | 2008-108829 A | 5/2008 |
| JP | 2009-088078 A | 4/2009 |
| JP | 2010-238850 A | 10/2010 |
| JP | 2011-507236 A | 3/2011 |
| JP | 2011-077144 A | 4/2011 |
| JP | 2013-077597 A | 4/2013 |
| JP | 2013-089797 A | 5/2013 |
| JP | 2013-175496 A | 9/2013 |
| JP | 2013-179341 A | 9/2013 |
| JP | 2013-214737 A | 10/2013 |

OTHER PUBLICATIONS

English Translation of Japanese Office action issued in Patent Application No. JP 2013-239041 dated Aug. 17, 2017.
English Translation of Japanese Office action issued in Patent Application No. JP 2013-242716 dated Aug. 17, 2017.
Singapore Search Report issued in Singapore Patent Application No. 10201407598V dated Jul. 25, 2017.

* cited by examiner

SUBSTRATE CLEANING APPARATUS COMPRISING A SECOND JET NOZZLE SURROUNDING A FIRST JET NOZZLE

CROSS REFERENCE TO RELATED APPLICATIONS

This document claims priorities to Japanese Patent Application Number 2013-239040 filed Nov. 19, 2013, Japanese Patent Application Number 2013-239041 filed Nov. 19, 2013, Japanese Patent Application Number 2013-241960 filed Nov. 22, 2013 and Japanese Patent Application Number 2013-242716 filed Nov. 25, 2013, the entire contents of which are hereby incorporated by reference.

BACKGROUND

As semiconductor devices have been becoming finer in recent years, various material films having different properties are formed on a substrate, and are processed. In particular, in a damascene interconnect forming process in which interconnect trenches formed in a dielectric film are filled with a metal, an excessive metal is polished away by a polishing apparatus after a metal film is formed. Various films, such as a metal film, a barrier film, and a dielectric film, are exposed on a wafer surface that has been polished. Residues, such as slurry used in polishing and polishing debris, remain on these films that are exposed on the wafer surface. In order to remove these residues, the polished wafer is transported to a substrate cleaning apparatus, where the wafer surface is cleaned.

If cleaning of the wafer surface is insufficient, reliability problems, such as poor adhesion and a current leak due to the existence of the residues, may occur. Therefore, in manufacturing of a semiconductor device, cleaning of the wafer has been an important process for improving a yield of products.

As an apparatus for cleaning a substrate, there has been known a two-fluid cleaning apparatus that supplies a two-fluid jet, composed of a fluid mixture of a gas and a liquid, onto a surface of a substrate to thereby clean the substrate. As shown in FIG. 42, the two-fluid cleaning apparatus delivers the two-fluid jet from a two-fluid nozzle 500 onto a surface of a substrate W, while the two-fluid nozzle 500 is moved parallel to the surface of the substrate W, to generate shock waves by a collision between the two-fluid jet and the substrate W, thereby removing particles, such as abrasive grains and polishing debris, which exist on the surface of the substrate W.

However, as shown in FIG. 43, since the two-fluid jet reaches the substrate while spreading, an incident angle θ of the shock wave with respect to the substrate surface is small. As a result, as shown in FIG. 44, the shock waves do not impinge on particles existing in minute recesses on the substrate surface, thus failing to remove these particles.

FIG. 45 is a schematic view showing a structure of the two-fluid cleaning apparatus shown in FIG. 42. As shown in FIG. 45, a gas supply line 555 for supplying a gas into a gas pocket 560 formed in the two-fluid nozzle 500, and a liquid supply line 557 for supplying a liquid into a mixing chamber 561 formed in the two-fluid nozzle 500 are coupled to the two-fluid nozzle 500. The two-fluid nozzle 500 has a gas introduction port 564 at its upper portion, and the gas supply line 555 is coupled through this gas introduction port 564 to the two-fluid nozzle 500.

The liquid supply line 557 extends downwardly through the gas pocket 560 that is formed in the two-fluid nozzle 500. A liquid outlet 557a of the liquid supply line 557 is located in the two-fluid nozzle 500. The gas pocket 560 is located above the liquid outlet 557a of the liquid supply line 557, and the mixing chamber 561 is located below the liquid outlet 557a of the liquid supply line 557. The liquid, such as pure water, is supplied through the liquid supply line 557 into the mixing chamber 561 formed in the two-fluid nozzle 500.

The gas supply line 555 is provided with a gas supply valve 571 and a filter 572. The gas (e.g., inert gas, such as nitrogen gas) flowing in the gas supply line 555 passes through the gas supply valve 571 and the filter 572 in this order and further flows through the gas introduction port 564 into the gas pocket 560 of the two-fluid nozzle 500. The gas supply valve 571 may be a flow control valve (e.g., a mass flow controller), an air operated valve, an on-off valve, or the like.

The liquid and the gas are mixed in the mixing chamber 561 to form a high-pressure two-fluid mixture. During supplying of the gas into the gas pocket 560, as shown in FIG. 46, the gas supply valve 571 is opened and closed with a short period (e.g., 0.1 to 1.0 second). Therefore, the gas is intermittently supplied into the gas pocket 560, and as a result, a flow rate of the two-fluid mixture varies periodically. A jet of the two-fluid mixture that is pulsating in this manner is delivered onto the surface of the substrate, thereby removing the abrasive grains and the polishing debris from the surface of the substrate.

When the gas supply valve 571 is periodically opened and closed, the flow rate of the two-fluid mixture formed in the mixing chamber 561 is expected to pulsate in accordance with a flow rate of the gas as well. However, when the gas supply valve 571 is opened and closed with a short period, an amplitude of the flow rate of the two-fluid mixture becomes smaller than expected, as shown in FIG. 47, due to a residual pressure existing in the gas pocket 560. As a result, a cleaning performance of the two-fluid jet is lowered.

FIG. 48 is a schematic view showing a droplet of the two-fluid mixture. As shown in FIG. 48, the droplet, which constitutes the two-fluid jet, typically has a size of several tens of μm, while fine particles on the substrate W have a size of at most 100 nm. Therefore, as shown in FIG. 49, the droplet cannot enter recesses (e.g., stepped portions of patterns and scratches) formed on the substrate surface, and as a result, cannot remove the fine particles existing in these recesses.

The two-fluid cleaning apparatus has an advantage that a back contamination of the substrate W does not occur, because a cleaning tool, such as a brush or a sponge, is not brought into contact with the substrate W. However, it is difficult for such cleaning apparatus using only the two-fluid jet to sufficiently remove the particles attached to the surface of the substrate W. In particular, the two-fluid jet cannot remove the fine particles existing in the recesses (e.g., stepped portions of patterns and scratches) formed on the substrate surface.

SUMMARY OF THE INVENTION

In an embodiment, there is provided a substrate cleaning apparatus capable of removing particles that exist in minute recesses formed on a substrate surface.

In an embodiment, there is provided a substrate cleaning apparatus capable of supplying a two-fluid jet onto a substrate while causing the two-fluid jet to pulsate greatly.

In an embodiment, there is provided a substrate cleaning apparatus capable of making droplets of a two-fluid mixture smaller to improve a substrate cleaning effect.

In an embodiment, there is provided a substrate cleaning apparatus capable of cleaning a surface of a substrate highly efficiently with use of a two-fluid jet.

In an embodiment, there is provided a substrate processing apparatus incorporating such substrate cleaning apparatus.

Embodiments, which will be described below, relate to a substrate cleaning apparatus that delivers a two-fluid jet, composed of a gas and a liquid, onto a substrate, such as a wafer, to thereby clean the substrate, and particularly relates to a substrate cleaning apparatus that delivers the two-fluid jet onto a surface of a polished substrate to thereby clean the substrate. The substrate cleaning apparatus according to the present invention is applicable to cleaning of not only a wafer having a diameter of 300 mm but also a wafer having a diameter of 450 mm, and is further applicable to a manufacturing process of a flat panel, a manufacturing process of an image sensor, such as CMOS and CCD, a manufacturing process of a magnetic film for MRAM, and other processes.

In an embodiment, there is provided a substrate cleaning apparatus comprising: a substrate holder configured to hold a substrate; and a two-fluid nozzle configured to deliver a two-fluid jet onto a surface of the substrate. The two-fluid nozzle includes a first jet nozzle configured to emit a first two-fluid jet and a second jet nozzle configured to emit a second two-fluid jet at a velocity higher than a velocity of the first two-fluid jet, and the second jet nozzle surrounds the first jet nozzle.

In an embodiment, the velocity of the second two-fluid jet is not less than a speed of sound.

In an embodiment, the substrate cleaning apparatus further comprises a nozzle moving mechanism configured to move the two-fluid nozzle in a radial direction of the substrate.

In an embodiment, the substrate cleaning apparatus further comprises a distance adjuster configured to change a distance between the two-fluid nozzle and the surface of the substrate.

In an embodiment, the substrate cleaning apparatus further comprises a third jet nozzle disposed inside the first jet nozzle and configured to emit a third two-fluid jet at a velocity higher than the velocity of the first two-fluid jet.

In an embodiment, the velocity of the third two-fluid jet is not less than a speed of sound.

In an embodiment, there is provided a substrate cleaning apparatus comprising: a substrate holder configured to hold a substrate; and a two-fluid nozzle configured to deliver a two-fluid jet onto a surface of the substrate. The two-fluid nozzle includes a first jet nozzle configured to emit a first fluid jet and a second jet nozzle configured to emit a second fluid jet at a velocity is higher than a velocity of the first fluid jet, the second jet nozzle surrounds the first jet nozzle, and one of the first fluid jet and the second fluid jet is a two-fluid jet, and other is a gas jet.

In an embodiment, there is provided a substrate processing apparatus comprising: a polishing unit configured to polish a substrate; and the above-described substrate cleaning apparatus configured to clean the substrate polished by the polishing unit.

According to the above-described embodiment, the second two-fluid jet having a higher velocity travels toward the surface of the substrate while surrounding the first two-fluid jet. Since there is a difference in velocity between the first two-fluid jet and the second two-fluid jet, the second two-fluid jet converges due to a contact with the first two-fluid jet. In this manner, since the second two-fluid jet converges, an incident angle of a shock wave with respect to the surface of the substrate becomes greater (i.e., approaches 90 degrees). As a result, the shock wave impinges on particles existing in minute recesses formed on the substrate surface, thereby removing these particles.

In an embodiment, there is provided a substrate cleaning apparatus comprising: a substrate holder configured to hold a substrate; a two-fluid nozzle configured to deliver a two-fluid jet onto a surface of the substrate; a gas supply line configured to supply a gas into a gas pocket formed in the two-fluid nozzle; a gas supply valve configured to open and close a gas passage of the gas supply line; a liquid supply line configured to supply a liquid into a mixing chamber formed in the two-fluid nozzle; a gas suction line configured to suck the gas that exists in the gas pocket; a gas suction valve configured to open and close a gas passage of the gas suction line; and a valve controller configured to cause the gas supply valve and the gas suction valve to repeat opening and closing operations with a same period, the valve controller being configured to control the operations of the gas supply valve and the gas suction valve such that the gas suction valve is in an open state when the gas supply valve is in a closed state.

In an embodiment, the valve controller is configured to cause the gas suction valve to open while causing the gas supply valve to close simultaneously.

In an embodiment, the valve controller is configured to cause the gas suction valve to open before causing the gas supply valve to close.

In an embodiment, the gas suction line is coupled to the two-fluid nozzle through a gas discharge port that is located above the mixing chamber.

In an embodiment, the period is in a range of 0.1 to 1.0 second.

In an embodiment, there is provided a substrate processing apparatus comprising: a polishing unit configured to polish a substrate; and the above-described substrate cleaning apparatus configured to clean the substrate polished by the polishing unit.

According to the above-described embodiment, the supply of the gas into the gas pocket of the two-fluid nozzle and the suction of the gas are alternately repeated. Specifically, the gas is supplied into the gas pocket when a residual pressure in the gas pocket has been removed. Therefore, a flow rate of the two-fluid mixture can largely fluctuate, and as a result, the substrate can be cleaned efficiently.

In an embodiment, there is provided a substrate cleaning apparatus comprising: a substrate holder configured to hold a substrate; a two-fluid nozzle configured to deliver a two-fluid jet onto a surface of the substrate; a gas supply line configured to supply a gas into a mixing chamber formed in the two-fluid nozzle; a liquid supply line configured to supply a liquid into the two-fluid nozzle; and a droplet-forming device configured to form droplets from the liquid that has been supplied into the two fluid nozzle and to supply the droplets into the mixing chamber.

In an embodiment, the droplet-forming device includes a liquid delivery pipe coupled to the liquid supply line and being in communication with the mixing chamber, a liquid supply valve configured to open and close a liquid passage of the liquid supply line, a liquid suction line configured to suck the liquid flowing in the liquid delivery pipe, a liquid suction valve configured to open and close a liquid passage of the liquid suction line, and a valve controller configured to alternately cause the liquid supply valve and the liquid suction valve to open and close.

In an embodiment, the droplet-forming device includes a liquid chamber that is in communication with the liquid supply line, and a piezoelectric element configured to push the liquid out of the liquid chamber to form the droplets.

In an embodiment, the two-fluid nozzle has a gas pocket that deliver the gas from the gas supply line into the mixing chamber, and the droplet-forming device has a droplet outlet surrounded by the gas pocket.

In an embodiment, the droplet-forming device has a flange that protrudes outwardly from the droplet outlet.

In an embodiment, the substrate cleaning apparatus further comprises an ultrasonic transducer configured to vibrate the liquid.

In an embodiment, there is provided a substrate processing apparatus comprising: a polishing unit configured to polish a substrate; and the above-described substrate cleaning apparatus configured to clean the substrate polished by the polishing unit.

According to the above-described embodiment, the droplets are broken up in the mixing chamber by a gas flow, thereby forming fine droplets. These fine droplets can easily enter recesses formed on the surface of the substrate, thereby removing particles existing in the recesses. Therefore, a cleaning effect of the substrate can be improved.

In an embodiment, there is provided a substrate cleaning apparatus comprising: a substrate holder configured to hold and rotate a substrate; a two-fluid nozzle configured to deliver a two-fluid jet onto a surface of the substrate; and at least one oscillator that is to come in contact with the substrate to vibrate the substrate.

In an embodiment, the oscillator is configured to rotate together with the substrate while vibrating the substrate.

In an embodiment, the oscillator includes a piezoelectric element, and a contact member that is mounted to the piezoelectric element and is to come in contact with the substrate.

In an embodiment, the oscillator is configured to vibrate the substrate in a direction perpendicular to the surface of the substrate.

In an embodiment, the oscillator is configured to vibrate the substrate in a direction parallel to the surface of the substrate.

In an embodiment, the at least one oscillator comprises at least one first oscillator configured to vibrate the substrate in a direction perpendicular to the surface of the substrate and at least one second oscillator configured to vibrate the substrate in a direction parallel to the surface of the substrate.

In an embodiment, the at least one oscillator comprises a plurality of oscillators, and at least two of the plurality of oscillators are configured to vibrate the substrate at different frequencies and/or different amplitudes.

In an embodiment, the substrate cleaning apparatus further comprises: a cleaning-liquid nozzle configured to supply a cleaning liquid onto a lower surface of the substrate; and an ultrasonic transducer configured to vibrate the cleaning liquid.

In an embodiment, there is provided a substrate processing apparatus comprising: a polishing unit configured to polish a substrate; and the above-described substrate cleaning apparatus configured to clean the substrate polished by the polishing unit.

According to the above-described embodiment, the vibration that is applied to the substrate can make it easier to separate the particles from the substrate. In this state, the two-fluid jet is supplied onto the substrate to remove the particles from the substrate. In this manner, a cleaning efficiency of the substrate can be enhanced by a combination of the vibration of the substrate and an impact of the two-fluid jet.

DESCRIPTION OF EMBODIMENTS

Figure 1:
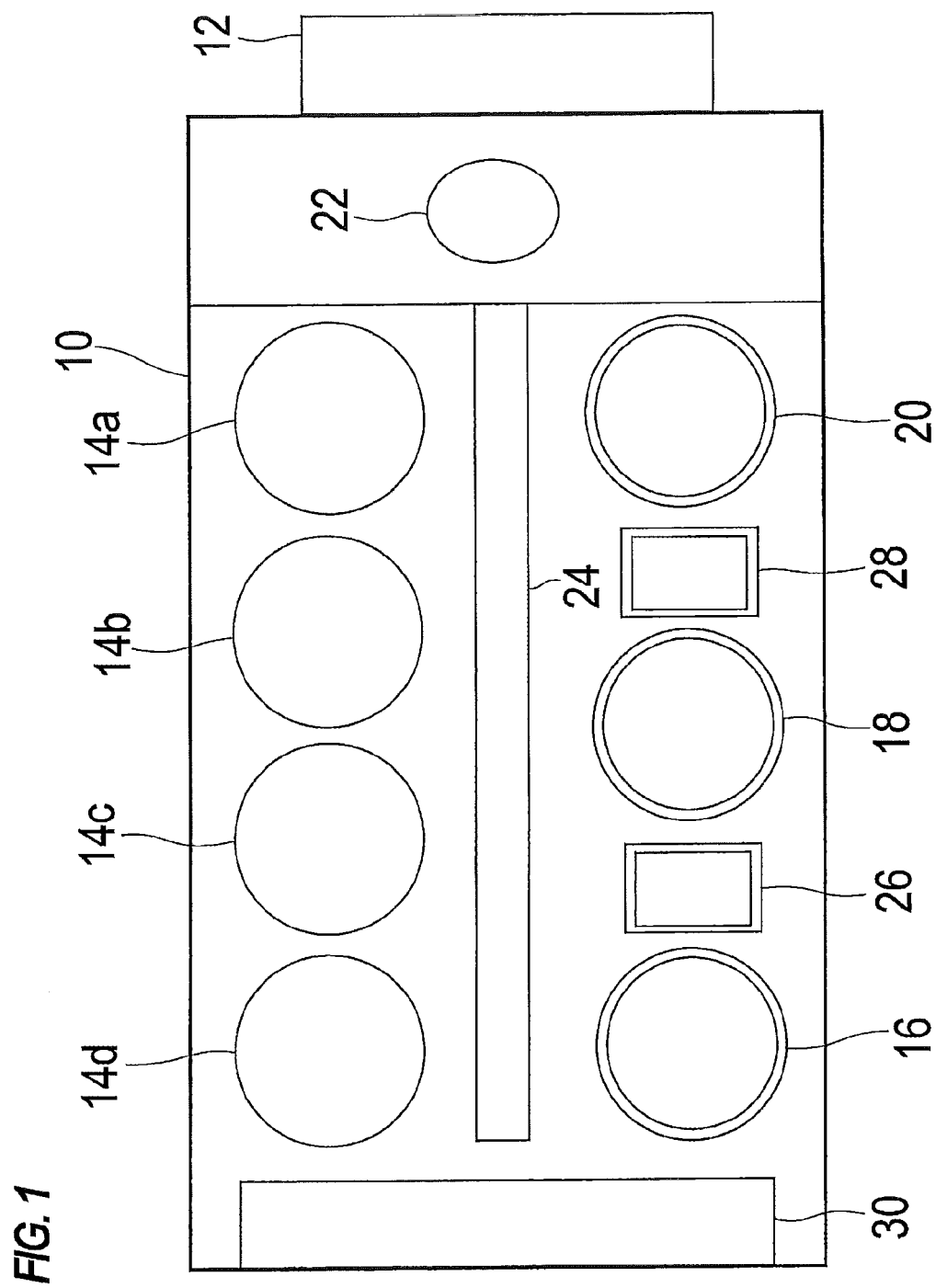
FIG. 1 is a plan view showing a whole structure of a substrate processing apparatus incorporating a substrate cleaning apparatus according to an embodiment.

Embodiments will be described with reference to the drawings. FIG. 1 is a plan view showing a whole structure of a substrate processing apparatus incorporating a substrate cleaning apparatus according to an embodiment. As shown in FIG. 1, the substrate processing apparatus includes an approximately-rectangular housing 10, and a loading port 12 on which a substrate cassette is placed. The substrate cassette houses therein a large number of substrates, such as wafers. The loading port 12 is disposed adjacent to the housing 10. The loading port 12 can be mounted with an open cassette, a SMIF (Standard Manufacturing Interface) pod, or a FOUP (Front Opening Unified Pod). Each of the SMIF and the FOUP is an airtight container which houses a substrate cassette therein and which, by covering it with a partition wall, can keep its internal environment isolated from an external environment.

In the housing 10, there are disposed a plurality of (e.g., four in this embodiment) polishing units 14a to 14d, a first cleaning unit 16 and a second cleaning unit 18 each for cleaning a polished substrate, and a drying unit 20 for drying a cleaned substrate. The polishing units 14a to 14d are arranged along a longitudinal direction of the substrate processing apparatus, and the cleaning units 16, 18 and the drying unit 20 are also arranged along the longitudinal direction of the substrate processing apparatus.

A first substrate transfer robot 22 is disposed in an area surrounded by the loading port 12, the polishing unit 14a, and the drying unit 20. Further, a substrate transport unit 24 is disposed parallel to the polishing units 14a to 14d. The first substrate transfer robot 22 receives a substrate, to be polished, from the loading port 12 and transfers the substrate to the substrate transport unit 24, and further receives a dried substrate from the drying unit 20 and returns the dried substrate to the loading port 12. The substrate transport unit 24 transports a substrate received from the first substrate transfer robot 22, and transfers the substrate between the polishing units 14a to 14d. Each of the polishing units is configured to polish a surface of a substrate, such as a wafer, by bringing the substrate into sliding contact with a polishing surface while supplying a polishing liquid (slurry) onto the polishing surface.

A second substrate transfer robot 26 for transporting a substrate between the cleaning units 16, 18 and the substrate transport unit 24 is provided between the first cleaning unit 16 and the second cleaning unit 18. A third substrate transfer robot 28 for transporting a substrate between the second cleaning unit 18 and the drying unit 20 is provided between these units 18, 20. Further, an operation controller 30 for controlling operations of each of the units of the substrate processing apparatus is provided in the housing 10.

The first cleaning unit 16 is a substrate cleaning apparatus configured to clean a substrate by scrubbing both a front surface and a rear surface of the substrate with roll sponges in the presence of a chemical liquid. The second cleaning unit 18 is a substrate cleaning apparatus of two-fluid type according to an embodiment. The drying unit 20 is a spin drying apparatus configured to hold a substrate, eject IPA vapor from a moving nozzle to dry the substrate, and rotate the substrate at a high speed to further dry the substrate.

The substrate is polished by at least one of the polishing units 14a to 14d. The polished substrate is cleaned by the first cleaning unit 16 and the second cleaning unit 18, and the cleaned substrate is then dried by the drying unit 20.

Figure 2:
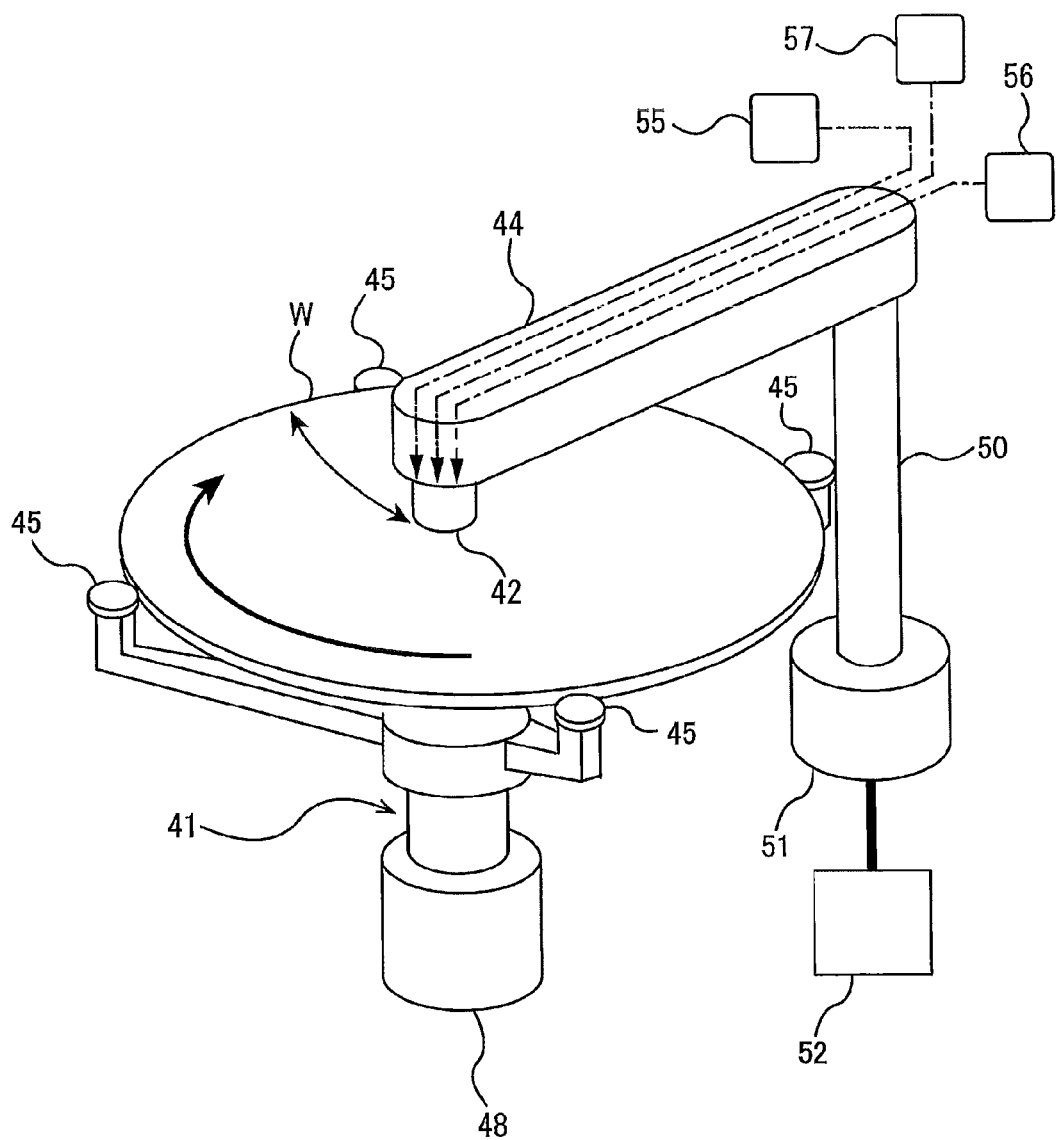
FIG. 2 is a perspective view showing the substrate cleaning apparatus, according to the embodiment, used as a second cleaning unit.

FIG. 2 is a perspective view showing the substrate cleaning apparatus, according to an embodiment, used as the second cleaning unit 18. As shown in FIG. 2, this substrate cleaning apparatus includes a substrate holder 41 configured to horizontally hold and rotate a wafer W, which is an example of a substrate, a two-fluid nozzle 42 configured to deliver a two-fluid jet to an upper surface of the wafer W, and a nozzle arm 44 that holds this two-fluid nozzle 42. A first gas supply source 55, a second gas supply source 56, and a liquid supply source 57 are coupled to the two-fluid nozzle 42.

The substrate holder 41 includes a plurality of (e.g., four in FIG. 2) chucks 45 for holding a periphery of the wafer W, and a motor 48 coupled to the chucks 45. The chucks 45 hold the wafer W horizontally, and in this state, the wafer W is rotated about its central axis by the motor 48.

The two-fluid nozzle 42 is disposed above the wafer W. The two-fluid nozzle 42 is mounted to one end of the nozzle arm 44, and a pivot shaft 50 is coupled to other end of the nozzle arm 44. The two-fluid nozzle 42 is coupled to a nozzle moving mechanism 51 through the nozzle arm 44 and the pivot shaft 50. More specifically, the pivot shaft 50 is coupled to the nozzle moving mechanism 51 that is configured to cause the nozzle arm 44 to pivot. This nozzle moving mechanism 51 is configured to rotate the pivot shaft 50 through a predetermined angle to thereby cause the nozzle arm 44 to pivot in a plane parallel to the wafer W. As the nozzle arm 44 pivots, the two-fluid nozzle 42, which is supported by the nozzle arm 44, moves in a radial direction of the wafer W.

The nozzle moving mechanism 51 is coupled to a nozzle elevating mechanism 52 for elevating and lowering the pivot shaft 50, so that the two-fluid nozzle 42 can vertically move relative to the wafer W. This nozzle elevating mechanism 52 serves as a distance adjuster configured to change a distance between the two-fluid nozzle 42 and the surface of the wafer W.

The wafer W is cleaned as follows. First, the wafer W is rotated about its central axis by the substrate holder 41. In this state, the two-fluid nozzle 42 supplies the two-fluid jet onto the upper surface of the wafer W, and further moves in the radial direction of the wafer W. The upper surface of the wafer W is cleaned with the two-fluid jet.

Figure 3:
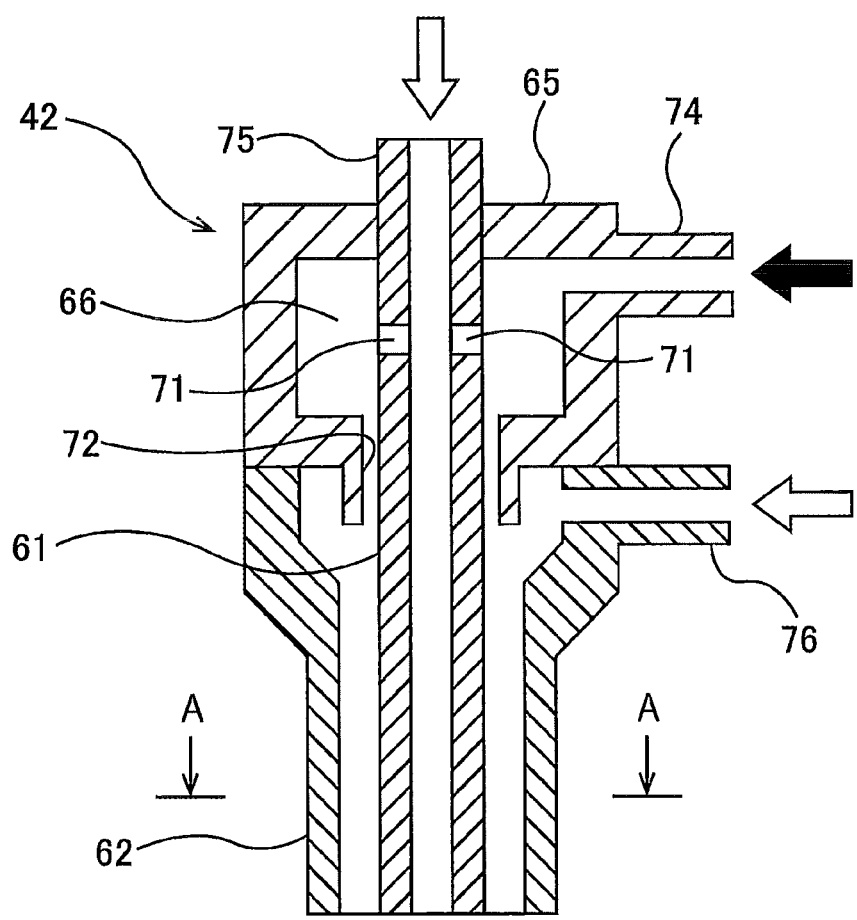
FIG. 3 is a vertical cross-sectional view showing an example of a two-fluid nozzle.
Figure 4:
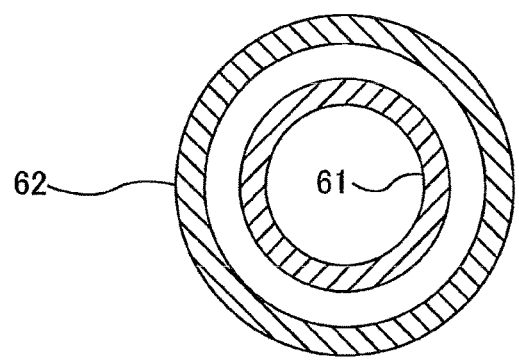
FIG. 4 is a cross-sectional view taken along line A-A of FIG. 3.

FIG. 3 is a vertical cross-sectional view showing an example of the two-fluid nozzle 42, and FIG. 4 is a cross-sectional view taken along line A-A of FIG. 3. As shown in FIG. 3, the two-fluid nozzle 42 includes a first jet nozzle 61, a second jet nozzle 62 that surrounds the first jet nozzle 61, and a liquid container 65 in which a liquid chamber 66 is formed. The liquid chamber 66 is in communication with the first jet nozzle 61 and the second jet nozzle 62. The liquid container 65 is coupled to an upper end of the second jet nozzle 62, and a lower end of the first jet nozzle 61 is located at the same height as a lower end of the second jet nozzle 62. As shown in FIG. 4, the first jet nozzle 61 and the second jet nozzle 62 are coaxially arranged.

As shown in FIG. 3, the liquid container 65 has a liquid introduction port 74 that is in communication with the liquid chamber 66. The liquid introduction port 74 is coupled to the liquid supply source 57. A liquid (e.g., pure water) is supplied through the liquid introduction port 74 into the liquid chamber 66. The first jet nozzle 61 extends through the liquid container 65. A plurality of first connection passages 71, which are in communication with the liquid chamber 66, are formed in the first jet nozzle 61. A second connection passage 72, which provides a fluid communication between the second jet nozzle 62 and the liquid chamber 66, is formed in a lower end of the liquid container 65. This second connection passage 72 surrounds the first jet nozzle 61.

A first gas introduction port 75, which is coupled to the first gas supply source 55, is formed on an upper end of the first jet nozzle 61. A second gas introduction port 76, which is coupled to the second gas supply source 56, is formed on an upper end of the second jet nozzle 62. The first gas supply source 55 supplies a first gas through the first gas introduction port 75 into the first jet nozzle 61, while the second gas supply source 56 supplies a second gas, whose pressure is higher than that of the first gas, through the second gas introduction port 76 into the second jet nozzle 62.

The liquid, the first gas, and the second gas are simultaneously supplied into the two-fluid nozzle 42. The liquid fills the liquid chamber 66, and then flows through the first connection passages 71 into the first jet nozzle 61, while the liquid passes through the second connection passage 72 into the second jet nozzle 62. In the first jet nozzle 61, the first gas and the liquid are mixed to form a first two-fluid jet. In the second jet nozzle 62, the second gas and the liquid are mixed to form a second two-fluid jet. The first gas and the second gas may be of the same type or may be of different types.

The second gas introduced into the second jet nozzle 62 has a higher pressure than a pressure of the first gas introduced into the first jet nozzle 61. Therefore, the second two-fluid jet travels at a higher velocity than a velocity of the first two-fluid jet. Specifically, the velocity of the second two-fluid jet is preferably equal to or more than a speed of sound. The reason for this is that strong shock waves are generated when the second two-fluid jet collides with the surface of the wafer W. The speed of sound is 331.45 m/s under conditions of a temperature of 0° C. and an atmospheric pressure of 1 atm.

Figure 5:
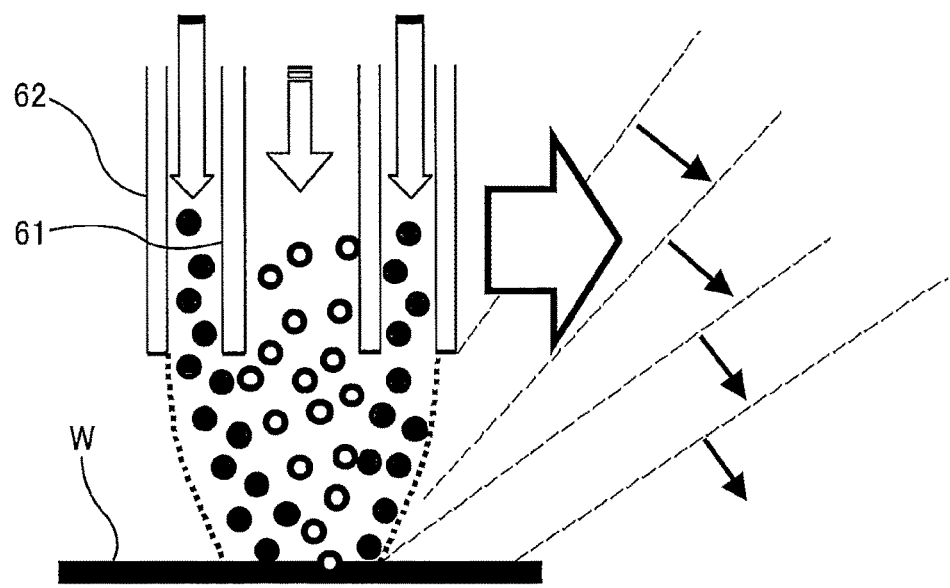
FIG. 5 is a schematic view showing a first two-fluid jet and a second two-fluid jet ejected from a first jet nozzle and a second jet nozzle, respectively.
Figure 6:
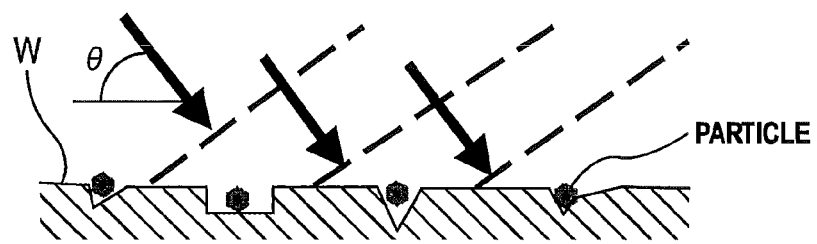
FIG. 6 is a schematic view showing shock waves when the second two-fluid jet collides with a surface of a wafer.

FIG. 5 is a schematic view showing the first two-fluid jet and the second two-fluid jet ejected from the first jet nozzle 61 and the second jet nozzle 62, respectively. There is a difference in velocity between the first two-fluid jet and the second two-fluid jet. Therefore, as shown in FIG. 5, the second two-fluid jet converges due to contact with the first two-fluid jet. In this manner, since the second two-fluid jet converges, an incident angle of the shock wave with respect to the surface of the wafer W becomes larger (i.e., approaches 90 degrees), as shown in FIG. 6. As a result, the shock waves impinge on particles existing in minute recesses formed on the surface of the substrate, thus removing these particles. In particular, fine particles, having a size of at most 100 nm and existing in the recesses (e.g., stepped portions of patterns and scratches), can be removed.

The above-discussed structure of the two-fluid nozzle shown in FIG. 3 is given by way of an example, and other structure may be employed. For example, a first gas and a first liquid may be supplied respectively from a first gas supply source and a first liquid supply source into the first jet nozzle 61, while a second gas and a second liquid may be supplied respectively from a second gas supply source and a second liquid supply source into the second jet nozzle 62. In this case, types of the first gas and the first liquid may be different from types of the second gas and the second liquid. For example, functional water (e.g., hydrogen water, ammonia water, or liquid containing isopropyl alcohol) may be used for one of the first liquid and the second liquid, while pure water may be used for the other.

One of the first fluid jet ejected from the first jet nozzle 61 and the second fluid jet ejected from the second jet nozzle 62 may be a two-fluid jet, while the other may be a gas jet. For example, the first jet nozzle 61 may be constructed to emit a low-speed gas jet, while the second jet nozzle 62 may be constructed to emit a high-speed two-fluid jet. In another example, the second jet nozzle 62 may be constructed to emit a high-speed gas jet, while the first jet nozzle 61 may be constructed to emit a low-speed two-fluid jet.

Figure 7:
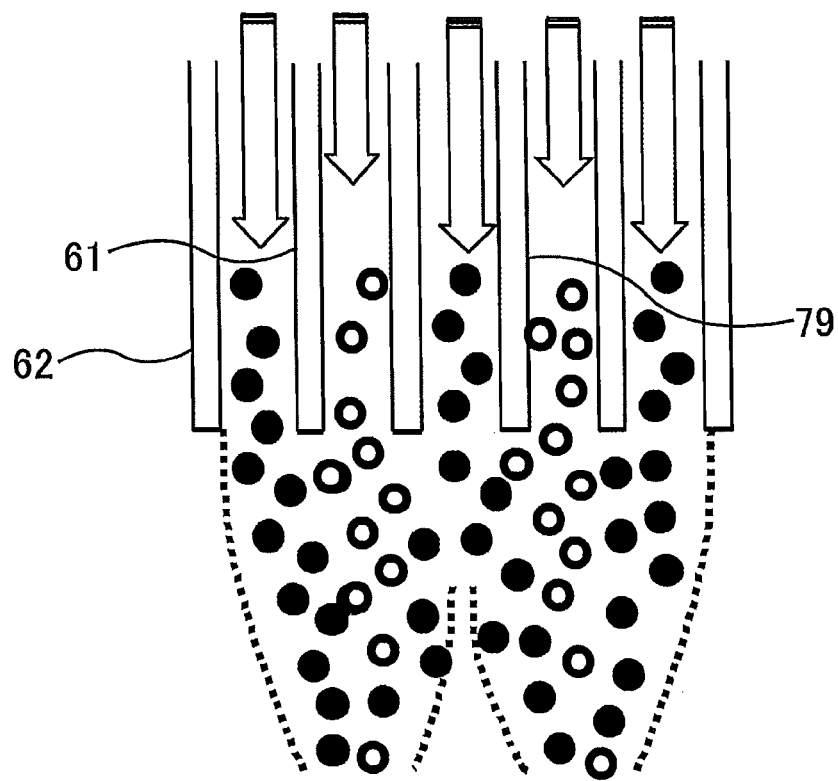
FIG. 7 is a schematic view showing another embodiment of the two-fluid nozzle.
Figure 8:
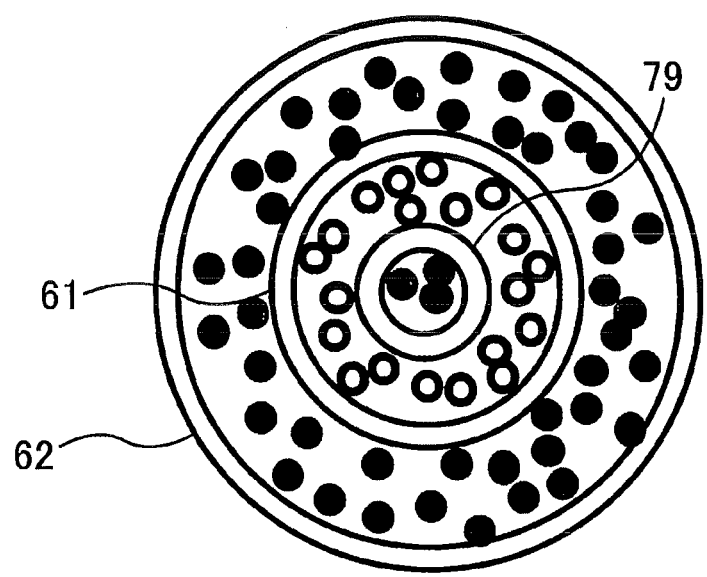
FIG. 8 is a schematic view showing the first jet nozzle, the second jet nozzle, and a third jet nozzle as viewed from an axial direction thereof.

FIG. 7 is a schematic view showing another embodiment of the two-fluid nozzle. Structures that are not described particularly in this embodiment are identical to those of the embodiment shown in FIG. 3. In this embodiment, a third jet nozzle 79 is disposed inside the first jet nozzle 61. The first jet nozzle 61, the second jet nozzle 62, and the third jet nozzle 79 are arranged coaxially as shown in FIG. 8. The third jet nozzle 79 emits a third two-fluid jet at a velocity higher than the velocity of the first two-fluid jet. More specifically, the velocities of the second two-fluid jet and the third two-fluid jet are higher than the velocity of the first two-fluid jet. The velocities of the second two-fluid jet and the third two-fluid jet are preferably not less than the speed of sound. The second two-fluid jet having the higher velocity converges due to a contact with the first two-fluid jet having the lower velocity, and the third two-fluid jet having the higher velocity spreads due to a contact with the first two-fluid jet having the lower velocity.

Either the first fluid jet ejected from the first jet nozzle 61 or the second and third fluid jets ejected from the second and third jet nozzles 62, 79 may be a two-fluid jet, while the other may be a gas jet. For example, the first jet nozzle 61 may be constructed to emit a gas jet having a low velocity, while the second and third jet nozzles 62, 79 may be each constructed to emit a two-fluid jet having a high velocity. In another example, the second and third jet nozzles 62, 79 may be each constructed to emit a gas jet having a high velocity, while the first jet nozzle 61 may be constructed to emit a two-fluid jet having a low velocity.

Figure 9:
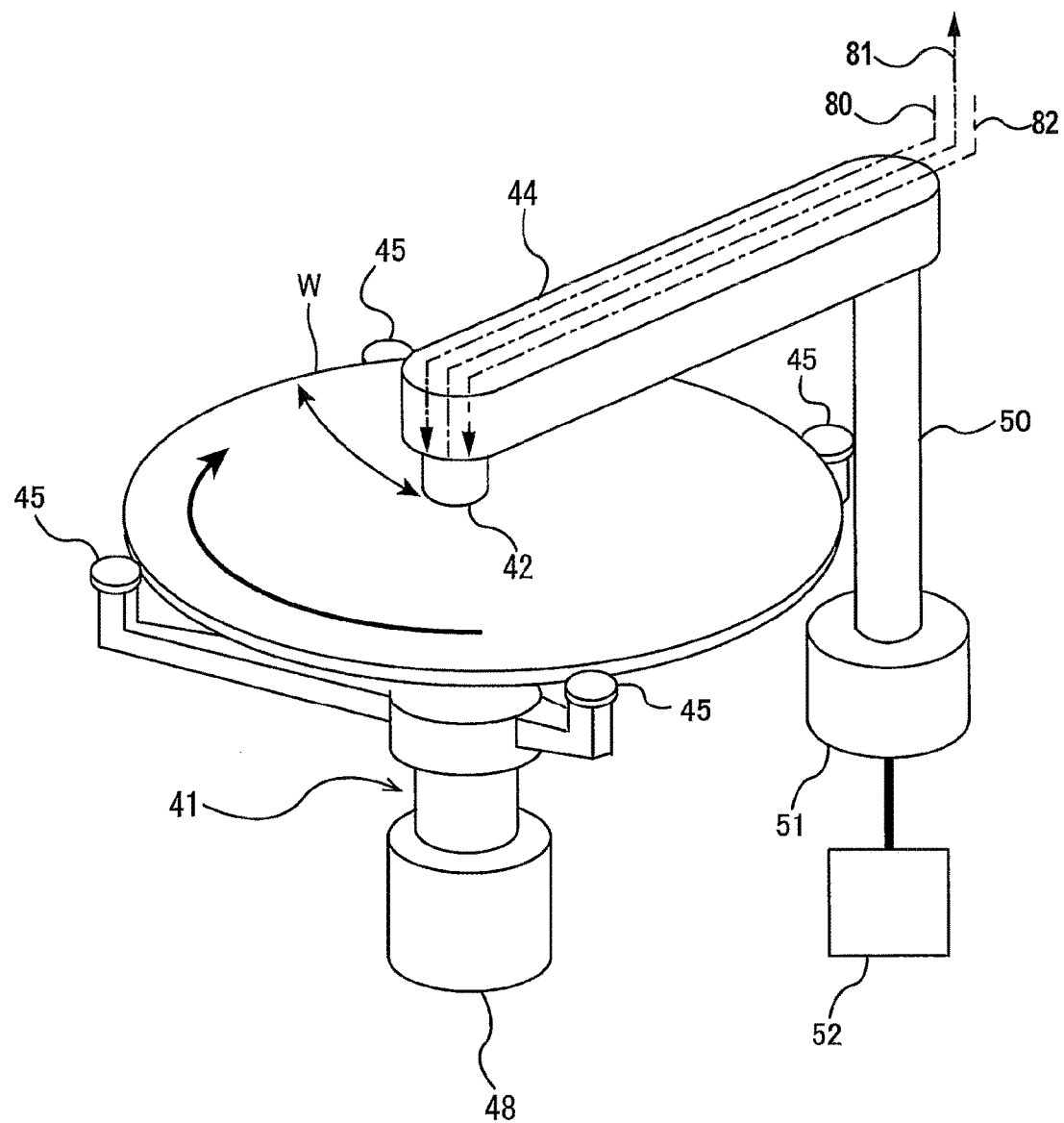
FIG. 9 is a perspective view showing still another embodiment of the substrate cleaning apparatus used as the second cleaning unit.

FIG. 9 is a perspective view showing still another embodiment of the substrate cleaning apparatus used as the second cleaning unit 18. Structures and operations of the substrate cleaning apparatus that are not described particularly in this embodiment are identical to those of the embodiment shown in FIG. 2, and repetitive descriptions thereof are omitted. As shown in FIG. 9, this substrate cleaning apparatus includes substrate holder 41 configured to horizontally hold and rotate a wafer W, which is an example of a substrate, two-fluid nozzle 42 configured to deliver a two-fluid jet onto an upper surface of the wafer W, and nozzle arm 44 that holds this two-fluid nozzle 42. A gas supply line 80, a gas suction line 81, and a liquid supply line 82 are coupled to the two-fluid nozzle 42.

Figure 10:
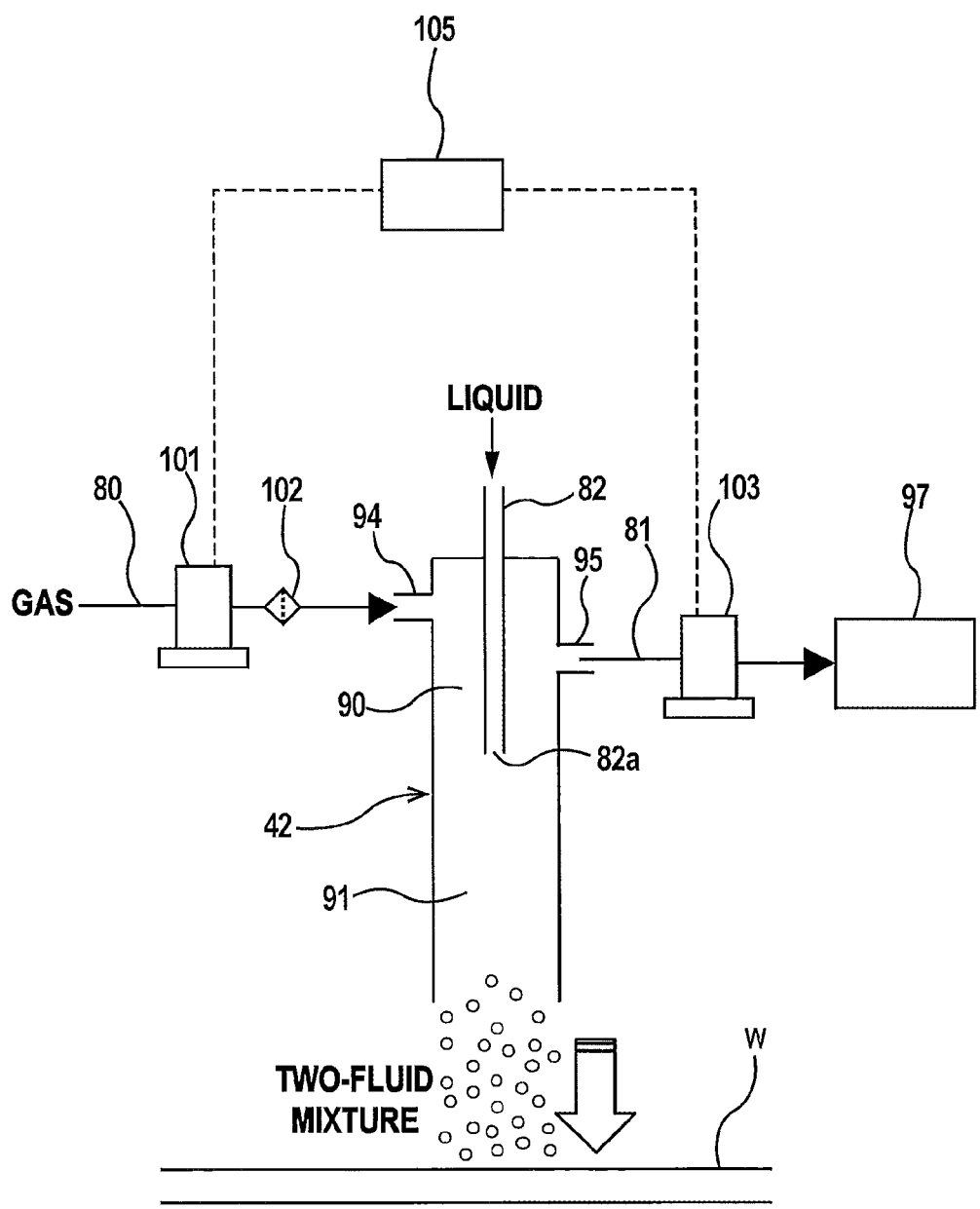
FIG. 10 is a schematic view showing a structure of the substrate cleaning apparatus.

FIG. 10 is a schematic view showing a structure of the substrate cleaning apparatus. As shown in FIG. 10, the gas supply line 80 that supplies a gas into a gas pocket 90 formed in the two-fluid nozzle 42, the liquid supply line 82 that supplies a liquid into a mixing chamber 91 formed in the two-fluid nozzle 42, and the gas suction line 81 that sucks a gas existing in the gas pocket 90 are coupled to the two-fluid nozzle 42.

The two-fluid nozzle 42 has a gas introduction port 94 provided on an upper portion of the two-fluid nozzle 42, and the gas supply line 80 is coupled to the two-fluid nozzle 42 through the gas introduction port 94. The two-fluid nozzle 42 further has a gas discharge port 95 provided on the upper portion of the two-fluid nozzle 42, and the gas suction line 81 is coupled to the two-fluid nozzle 42 through the gas discharge port 95. The gas introduction port 94 is located at a position higher than the gas discharge port 95.

The liquid supply line 82 extends downwardly through the gas pocket 90 of the two-fluid nozzle 42. The liquid supply line 82 has a liquid outlet 82a located in the two-fluid nozzle 42. The gas pocket 90 is located above the liquid outlet 82a of the liquid supply line 82, and the mixing chamber 91 is located below the liquid outlet 82a of the liquid supply line 82. The gas pocket 90 and the mixing chamber 91 are in communication with each other.

The liquid, such as pure water, is supplied through the liquid supply line 82 into the mixing chamber 91 formed in the two-fluid nozzle 42. The liquid may be delivered in the liquid supply line 82 by a pump that pressurizes the liquid, or may be delivered in the liquid supply line 82 by an attraction of a negative pressure produced in the two-fluid nozzle 42 by the gas suction line 81.

In order to prevent the gas suction line 81 from sucking the liquid in the two-fluid nozzle 42, the gas discharge port 95 is located above the mixing chamber 91 of the two-fluid nozzle 42 (i.e., at a position higher than the liquid outlet 82a of the liquid supply line 82).

The gas supply line 80 is provided with a gas supply valve 101 and a filter 102. The gas (e.g., inert gas, such as nitrogen gas) flowing in the gas supply line 80 passes through the gas supply valve 101 and the filter 102 in this order, and then flows through the gas introduction port 94 into the gas pocket 90 of the two-fluid nozzle 42. The liquid from the liquid supply line 82 and the gas from the gas supply line 80 are mixed in the mixing chamber 91 to form a high-pressure two-fluid jet.

The gas supply valve 101 operates so as to repeatedly open and close a gas passage of the gas supply line 80 with a predetermined period. Therefore, the gas is intermittently supplied into the gas pocket 90. As a result, a flow rate of the two-fluid jet periodically varies. The two-fluid jet that is pulsating in this manner is supplied onto the surface of the substrate to thereby remove abrasive grains and polishing debris from the surface of the substrate.

A vacuum source 97, such as a vacuum pump, is coupled to the gas suction line 81. This gas suction line 81 is provided with a gas suction valve 103. The gas suction valve 103 operates so as to repeatedly open and close a gas passage of the gas suction line 81 with the same period as that of the gas supply valve 101. Therefore, the gas suction line 81 intermittently sucks the gas existing in the gas pocket 90. A flow control valve (e.g., mass flow controller), an air operated valve, an on-off valve, or the like may be used for the gas supply valve 101 and the gas suction valve 103.

During the supply of the liquid into the mixing chamber 91, opening and closing operations of the gas supply valve 101 and the gas suction valve 103 are repeated with a predetermined period (e.g., 0.1 to 1.0 second) so as to repeat the supply of the gas into the gas pocket 90 and the suction of the gas from the gas pocket 90 alternately. The gas supply valve 101 and the gas suction valve 103 are coupled to a valve controller 105, so that the opening and closing operations of the gas supply valve 101 and the gas suction valve 103 are controlled by the valve controller 105.

Figure 11:
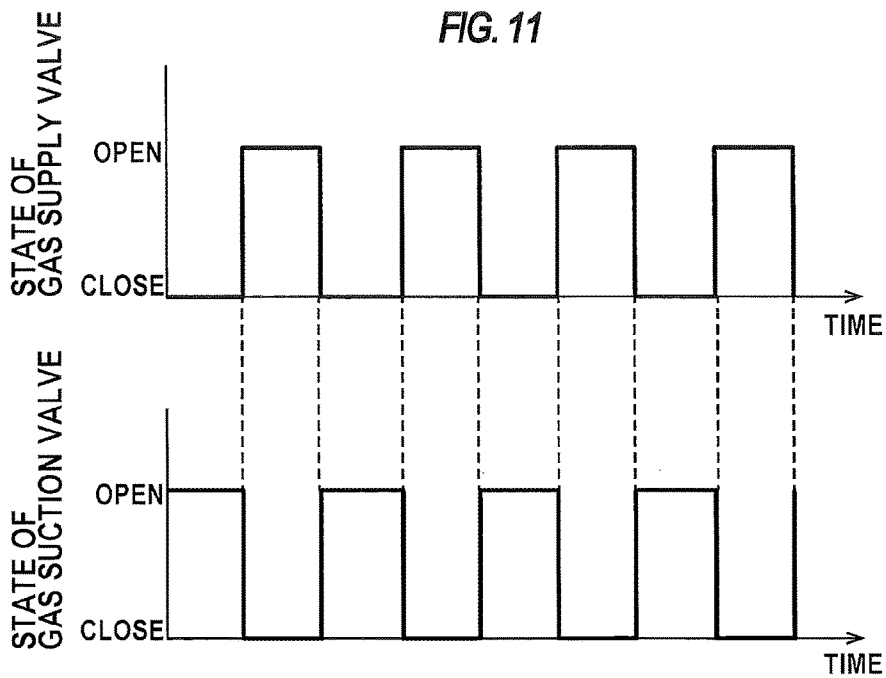
FIG. 11 is a graph showing open and closed states of a gas supply valve and a gas suction valve.

FIG. 11 is a graph showing open and closed states of the gas supply valve 101 and the gas suction valve 103. In FIG. 11, vertical axis represents whether the gas supply valve 101 and the gas suction valve 103 are in the open state or the closed state, and horizontal axis represents time. As can be seen from FIG. 11, the gas supply valve 101 and the gas suction valve 103 repeat their opening and closing operations with the same period, while the open and closed states of the gas suction valve 103 are opposite to the open and closed states of the gas supply valve 101. More specifically, the gas suction valve 103 is closed at the same time as the gas supply valve 101 is opened, and the gas suction valve 103 is opened at the same time as the gas supply valve 101 is closed.

In this manner, as the gas supply valve 101 and the gas suction valve 103 are alternately opened and closed with the same period, the supply of the gas into the gas pocket 90 and the suction of the gas from the gas pocket 90 are alternately performed. The opening and closing operations of the gas supply valve 101 and the gas suction valve 103 are controlled by the valve controller 105. As shown in FIG. 11, the valve controller 105 is configured to cause the gas supply valve 101 and the gas suction valve 103 to repeat the opening and closing operations with the same period.

Figure 12:
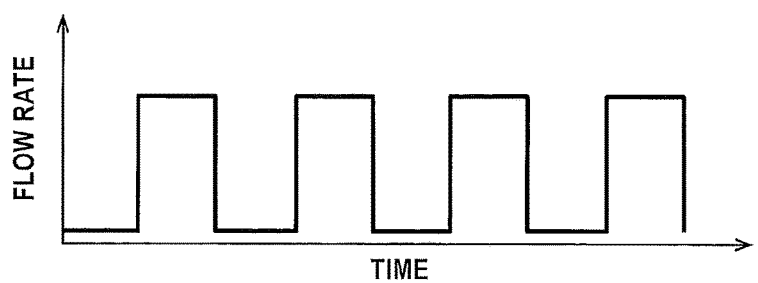
FIG. 12 is a graph showing a flow rate of a two-fluid mixture when the gas supply valve and the gas suction valve are periodically opened and closed according to timings shown in FIG. 11.

When the gas supply valve 101 is in a closed state, the gas suction valve 103 is in an open state. The gas in the gas pocket 90 is sucked through the gas suction line 81, and as a result, a residual pressure in the gas pocket 90 is removed. FIG. 12 is a graph showing a flow rate of the two-fluid jet when the gas supply valve 101 and the gas suction valve 103 are periodically opened and closed according to timings shown in FIG. 11. Since the residual pressure in the gas pocket 90 is removed before the gas is supplied into the gas pocket 90, the two-fluid jet pulsates greatly as shown in FIG. 12. As a result, the two-fluid jet can clean the surface of the substrate highly efficiently.

Figure 13:
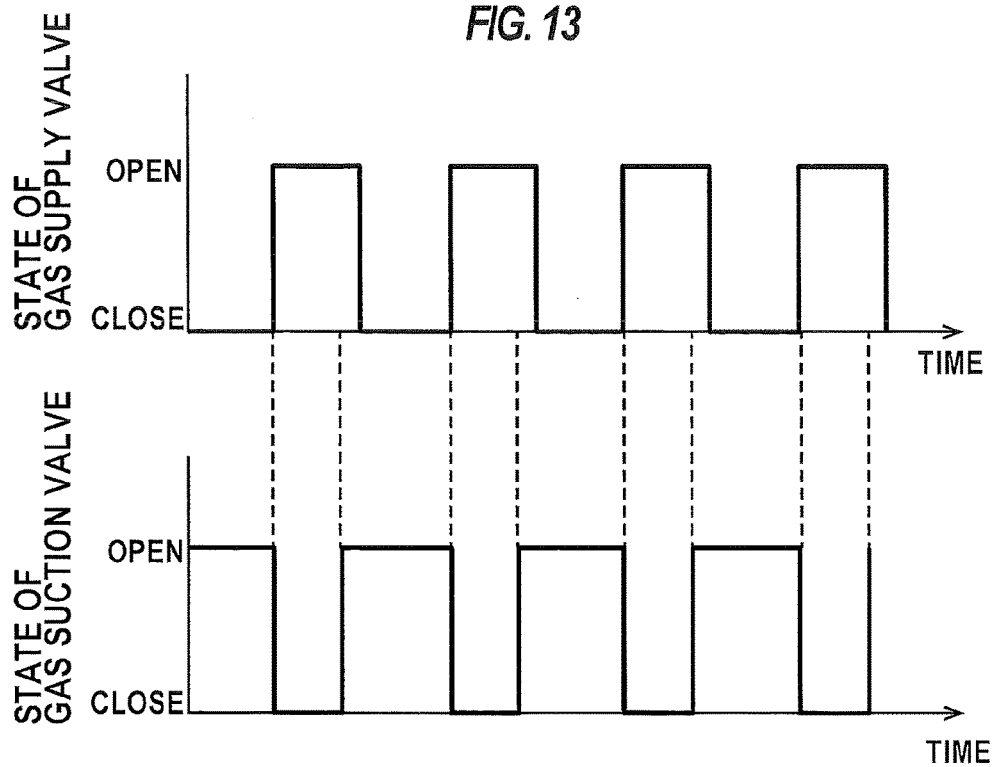
FIG. 13 is a graph showing open and closed states of the gas supply valve and the gas suction valve according to another embodiment.

FIG. 13 is a graph showing the open and closed states of the gas supply valve 101 and the gas suction valve 103 according to another embodiment. Structures and operations that are not described particularly in this embodiment are identical to those of the above-described embodiment, and repetitive descriptions thereof are omitted. This embodiment is the same as the above-described embodiment in that the gas suction valve 103 is closed at the same time as the gas supply valve 101 is opened, but is different in that the gas suction valve 103 is opened before the gas supply valve 101 is closed. An opening and closing period of the gas suction valve 103 is the same as an opening and closing period of the gas supply valve 101.

According to the embodiment shown in FIG. 13, when the gas supply valve 101 is closed, the residual pressure is removed without delay. In this case also, the gas suction valve 103 is in the open state when the gas supply valve 101 is in the closed state. The supply of the gas into the gas pocket 90 and the suction of the gas from the gas pocket 90 are alternately repeated. As a result, the flow rate of the two-fluid jet pulsates largely in almost the same manner as in the graph shown in FIG. 12. Therefore, the two-fluid jet can clean the surface of the substrate highly efficiently.

When the gas supply valve 101 is in the closed state, the gas suction valve 103 may not be in the open state at all times. For example, the gas suction valve 103 may be closed immediately before the gas supply valve 101 is opened (i.e., when the gas supply valve 101 is in the closed state).

Figure 14:
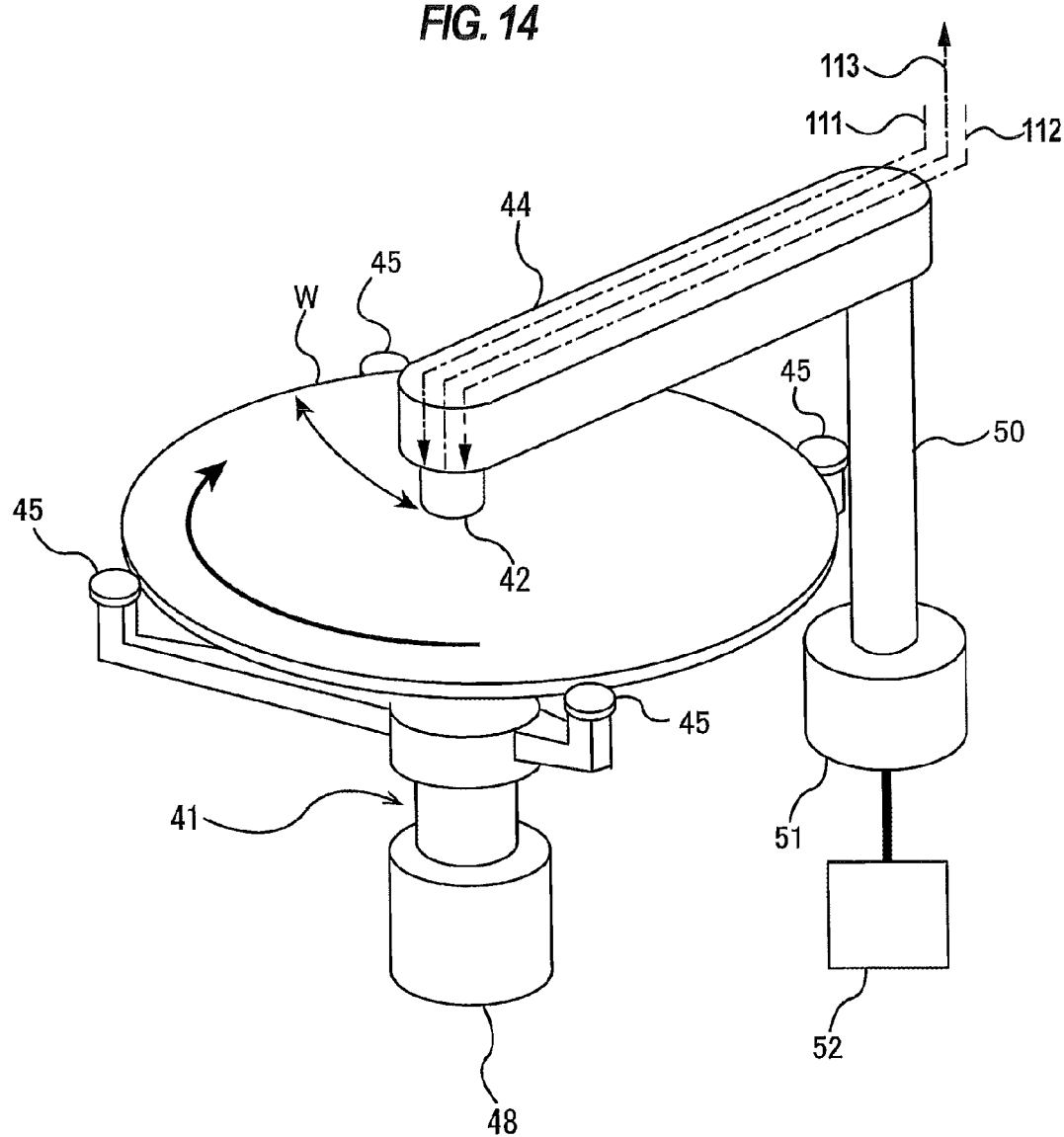
FIG. 14 is a perspective view showing still another embodiment of the substrate cleaning apparatus used as the second cleaning unit.

FIG. 14 is a perspective view showing still another embodiment of the substrate cleaning apparatus used as the second cleaning unit 18. Structures and operations of the substrate cleaning apparatus that are not described particularly in this embodiment are identical to those of the embodiment shown in FIG. 2, and repetitive descriptions thereof are omitted. As shown in FIG. 14, this substrate cleaning apparatus includes substrate holder 41 configured to horizontally hold and rotate a wafer W, which is an example of a substrate, two-fluid nozzle 42 configured to deliver a two-fluid jet onto an upper surface of the wafer W, and nozzle arm 44 that holds this two-fluid nozzle 42. A gas supply line 111, a liquid supply line 112, and a liquid suction line 113 are coupled to the two-fluid nozzle 42.

Figure 15:
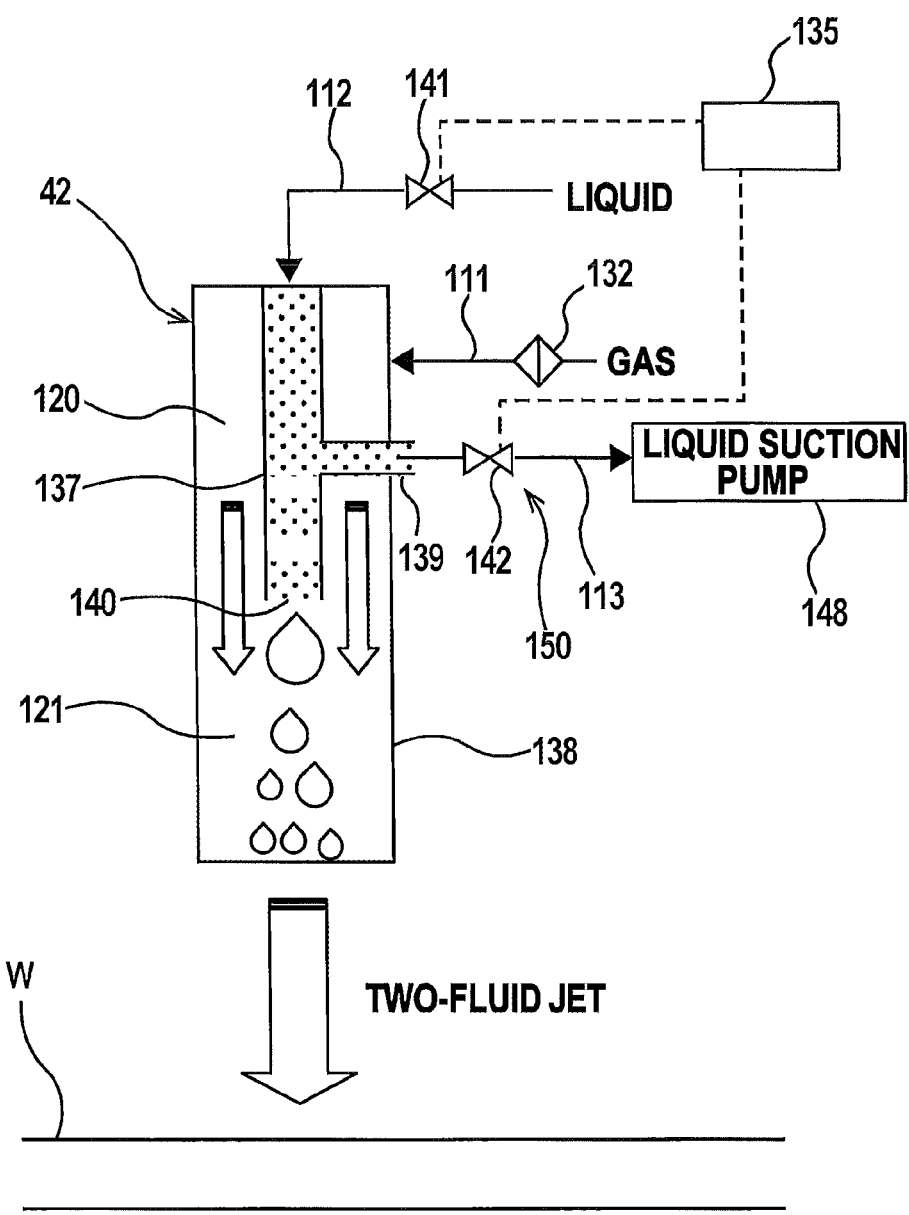
FIG. 15 is a schematic view showing an embodiment of a structure of the substrate cleaning apparatus.

FIG. 15 is a schematic view showing an embodiment of a structure of the substrate cleaning apparatus. As shown in FIG. 15, the gas supply line 111 that supplies a gas through a gas pocket 120, which is formed in the two-fluid nozzle 42, into a mixing chamber 121, the liquid supply line 112 that supplies a liquid (e.g., pure water) into a liquid delivery pipe 137 communicating with the mixing chamber 121, and the liquid suction line 113 that sucks the liquid flowing in the liquid delivery pipe 137 are coupled to the two-fluid nozzle 42.

The gas pocket 120, the mixing chamber 121, and the liquid delivery pipe 137 are located in the two-fluid nozzle 42. The liquid delivery pipe 137 is surrounded by an outer cylinder 138, and the gas pocket 120 is formed between the liquid delivery pipe 137 and the outer cylinder 138. The mixing chamber 121 is formed in the outer cylinder 138, and is located below the liquid delivery pipe 137 and the gas pocket 120. The gas pocket 120 is in communication with the mixing chamber 121. The gas from the gas supply line 111 is introduced through the gas pocket 120 into the mixing chamber 121.

The gas supply line 111 is provided with a filter 132. The gas (e.g., inert gas, such as nitrogen gas) flowing in the gas supply line 111 passes through the filter 132, and then flows into the gas pocket 120 of the two-fluid nozzle 42.

The liquid supply line 112 is provided with a liquid supply valve 141 for opening and closing a liquid passage of the liquid supply line 112. The liquid suction line 113 is provided with a liquid suction valve 142 for opening and closing a liquid passage of the liquid suction line 113. A flow control valve (e.g., mass flow controller), an air operated valve, an on-off valve, or the like may be used for the liquid supply valve 141 and the liquid suction valve 142.

One end of the liquid suction line 113 is coupled to a side surface of the liquid delivery pipe 137. More specifically, the liquid delivery pipe 137 has a liquid suction port 139 at the side surface thereof, and the liquid suction line 113 is coupled to this liquid suction port 139. The other end of the liquid suction line 113 is coupled to a liquid suction pump 148. The liquid supply line 112 is coupled to an upper open end of the liquid delivery pipe 137. The liquid supply valve 141 and the liquid suction valve 142 are coupled to valve controller 135, so that opening and closing operations of the liquid supply valve 141 and the liquid suction valve 142 are controlled by the valve controller 135. More specifically, the opening and closing operations of the liquid supply valve 141 and the liquid suction valve 142 are repeated with a predetermined period so as to alternately repeat the supply of the liquid into the liquid delivery pipe 137 and the suction of the liquid from the liquid delivery pipe 137.

Figure 16:
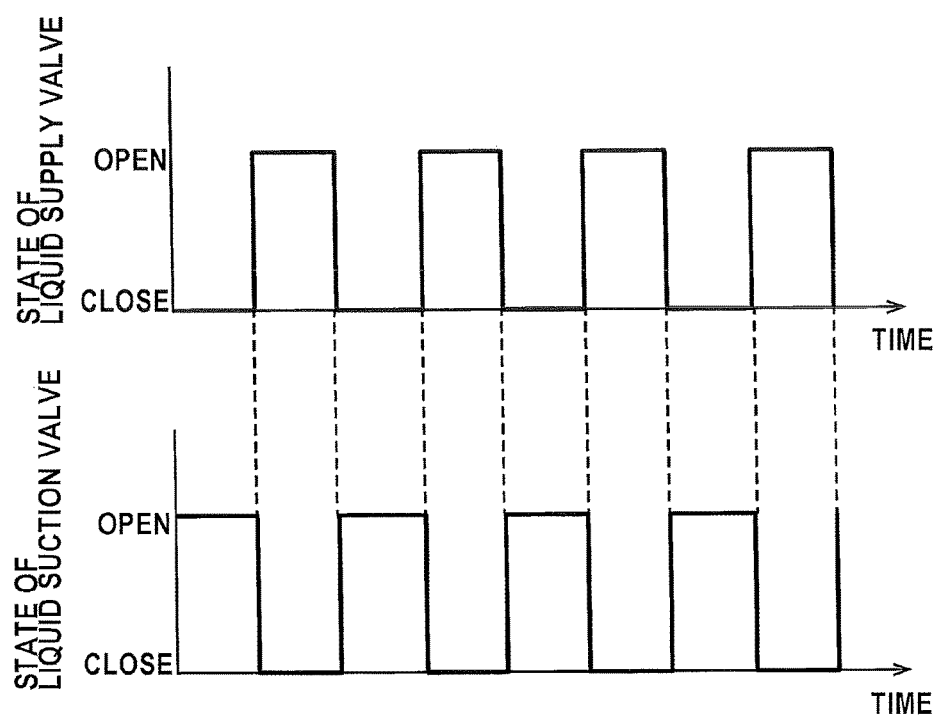
FIG. 16 is a graph showing open and closed states of a liquid supply valve and a liquid suction valve.

FIG. 16 is a graph showing open and closed states of the liquid supply valve 141 and the liquid suction valve 142. In FIG. 16, vertical axis represents whether the liquid supply valve 141 and the liquid suction valve 142 are in the open state or the closed state, and horizontal axis represents time. As can be seen from FIG. 16, the liquid supply valve 141 and the liquid suction valve 142 repeat their opening and closing operations with the same period, while the open and closed states of the liquid suction valve 142 are opposite to the open and closed states of the liquid supply valve 141. More specifically, the liquid suction valve 142 is closed at the same time as the liquid supply valve 141 is opened, and the liquid suction valve 142 is opened at the same time as the liquid supply valve 141 is closed.

In this manner, as the liquid supply valve 141 and the liquid suction valve 142 are alternately opened and closed with the same period, the supply of the liquid into the liquid delivery pipe 137 and the suction of the liquid from the liquid delivery pipe 137 are alternately performed. The opening and closing operations of the liquid supply valve 141 and the liquid suction valve 142 are controlled by the valve controller 135. As shown in FIG. 16, the valve controller 135 causes the liquid supply valve 141 and the liquid suction valve 142 to alternately open and close with the same period.

Figure 17:
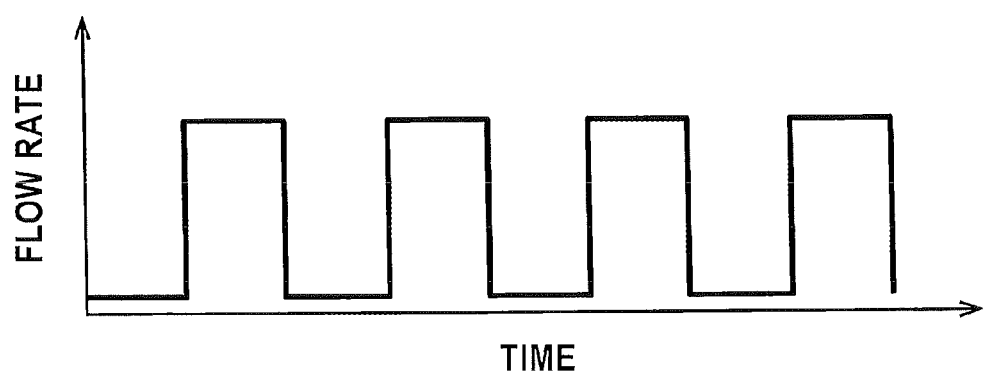
FIG. 17 is a graph showing a flow rate of a liquid when the liquid supply valve and the liquid suction valve are periodically opened and closed according to timings shown in FIG. 16.

FIG. 17 is a graph showing a flow rate of the liquid when the liquid supply valve 141 and the liquid suction valve 142 are periodically opened and closed according to timings shown in FIG. 16. Since the supply and the suction of the liquid are alternately performed, the flow rate of the liquid flowing in the liquid delivery pipe 137 greatly fluctuates, as shown in FIG. 17. As a result, the liquid is converted into droplets, which are discharged through a droplet outlet 140 that is provided at a lower end of the liquid delivery pipe 137. The droplets are supplied into the mixing chamber 121 located below the liquid delivery pipe 137.

Figure 18:
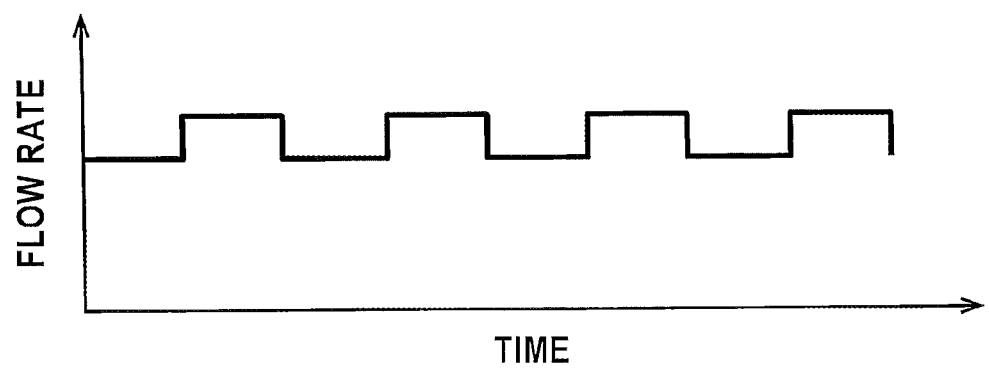
FIG. 18 is a graph showing a flow rate of the liquid when the liquid supply valve is periodically opened and closed while the liquid suction valve is closed.

FIG. 18 is a graph showing the flow rate of the liquid when the liquid supply valve 141 is periodically opened and closed while the liquid suction valve 142 is closed. As shown in FIG. 18, when only the liquid supply valve 141 is opened and closed, the flow rate of the liquid flowing in the liquid delivery pipe 137 does not fluctuate largely. As can be seen from a comparison of the graph shown in FIG. 17 and the graph shown in FIG. 18, the liquid flowing in the liquid delivery pipe 137 can be converted into the droplets by repeating the supply and the suction of the liquid alternately.

The gas pocket 120 is formed so as to surround the liquid delivery pipe 137, and the droplet outlet 140 of the liquid delivery pipe 137 is surrounded by the gas pocket 120. A gas flow travelling toward the mixing chamber 121 is formed in this gas pocket 120. The droplets discharged from the liquid outlet 140 are broken up in the mixing chamber 121 by the gas flow, thereby forming finer droplets. Such fine droplets and the gas are mixed in the mixing chamber 121 to form the two-fluid jet.

Figure 19:
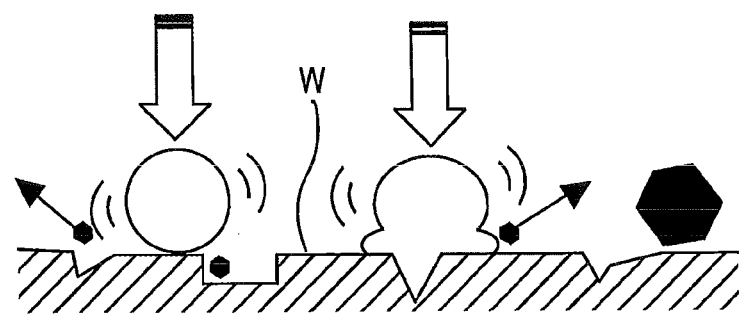
FIG. 19 is a schematic view showing the two-fluid jet when colliding with the surface of the wafer.

FIG. 19 is a schematic view showing the two-fluid jet when colliding with the surface of the wafer W. As shown in FIG. 19, the fine droplets, which constitute the two-fluid jet, enter minute recesses (e.g., stepped portions of patterns and scratches) formed on the surface of the wafer W, thus removing fine particles of at most 100 nm that exist in these recesses.

In this embodiment, a droplet-forming device 150 is constituted by the liquid delivery pipe 137 that is coupled to the liquid supply line 112 and is in communication with the mixing chamber 121, the liquid supply valve 141 configured to open and close the liquid passage of the liquid supply line 112, the liquid suction line 113 configured to suck the liquid flowing in the liquid delivery pipe 137, the liquid suction valve 142 configured to open and close the liquid passage of the liquid suction line 113, and the valve controller 135 configured to cause the liquid supply valve 141 and the liquid suction valve 142 to alternately open and close.

Figure 20:
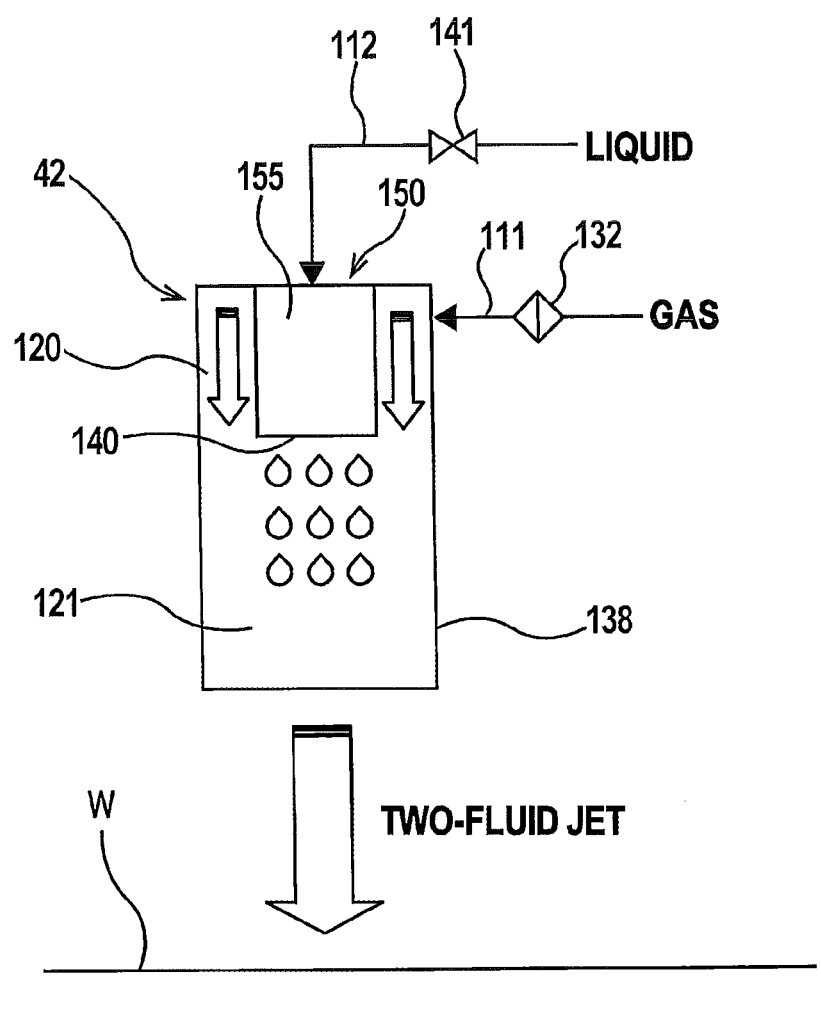
FIG. 20 is a schematic view showing another embodiment of a structure of the substrate cleaning apparatus.

FIG. 20 is a schematic view showing another embodiment of a structure of the substrate cleaning apparatus. Structures that are not described particularly in this embodiment are identical to those of the embodiment shown in FIG. 15, and repetitive descriptions thereof are omitted.

As shown in FIG. 20, a droplet-forming device 150 according to this embodiment includes a piezoelectric injector (or a piezoelectric injection device) 155. The piezoelectric injector 155 is disposed in the two-fluid nozzle 42. The gas pocket 120 is formed around the piezoelectric injector 155, and the mixing chamber 121 is located below the piezoelectric injector 155. This piezoelectric injector 155 is coupled to the liquid supply line 112, so that the liquid is supplied through the liquid supply line 112. The liquid is converted into droplets by the piezoelectric injector 155, and these droplets are supplied into the mixing chamber 121. In this embodiment, the liquid suction line 113, the liquid suction valve 142, and the valve controller 135, which are described above, are not provided. The liquid supply valve 141 may not be provided.

Figure 21:
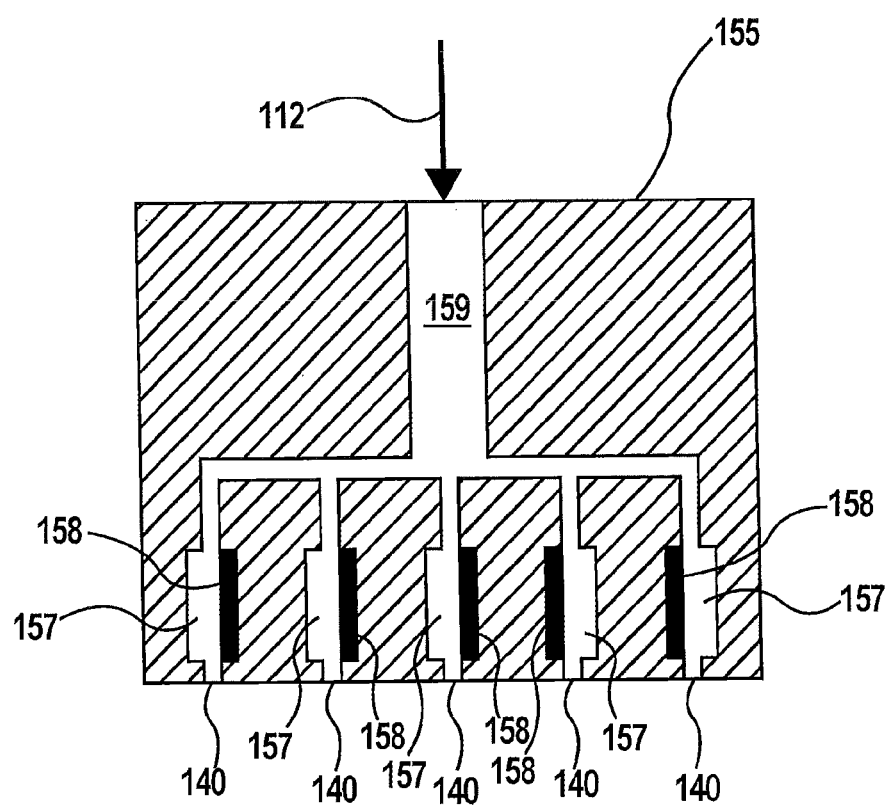
FIG. 21 is a vertical cross-sectional view of a piezoelectric injector.
Figure 22:
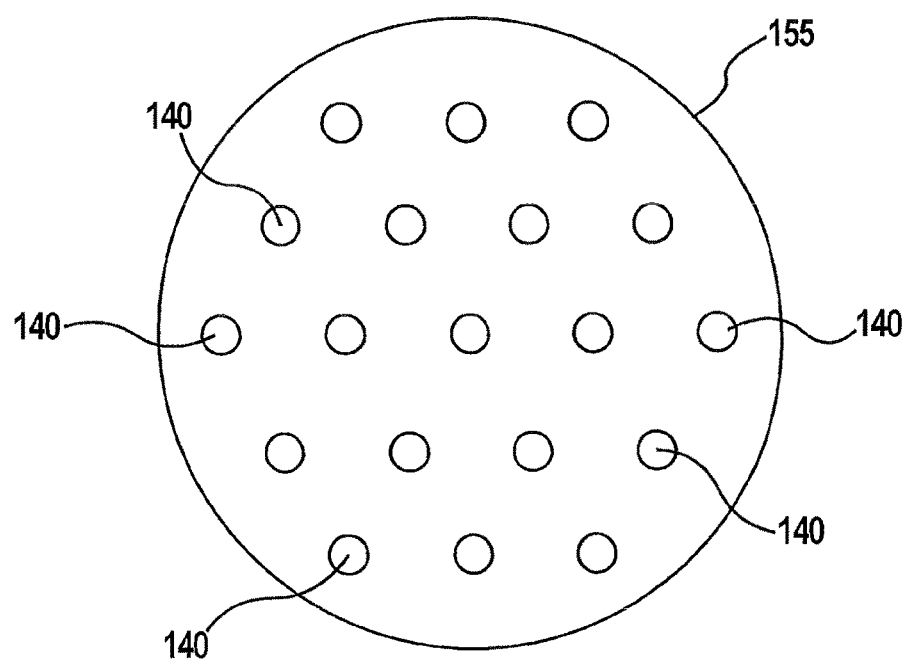
FIG. 22 is a bottom view of the piezoelectric injector.

FIG. 21 is a vertical cross-sectional view of the piezoelectric injector 155, and FIG. 22 is a bottom view of the piezoelectric injector 155. The piezoelectric injector 155 includes a plurality of liquid chambers 157, a plurality of piezoelectric elements 158 that adjoin these liquid chambers 157, respectively, and a distribution passage 159 coupled to the liquid chambers 157. The multiple liquid chambers 157 are in communication with the liquid supply line 112 through the distribution passage 159. Further, the multiple liquid chambers 157 are in communication with a plurality of droplet outlets 140, respectively. These droplet outlets 140 are formed in a lower surface of the piezoelectric injector 155. The droplet outlets 140 are surrounded by the gas pocket 120. An electric power supply (not shown) is coupled to each piezoelectric element 158, so that a voltage is periodically applied to each piezoelectric element 158.

Figure 23:
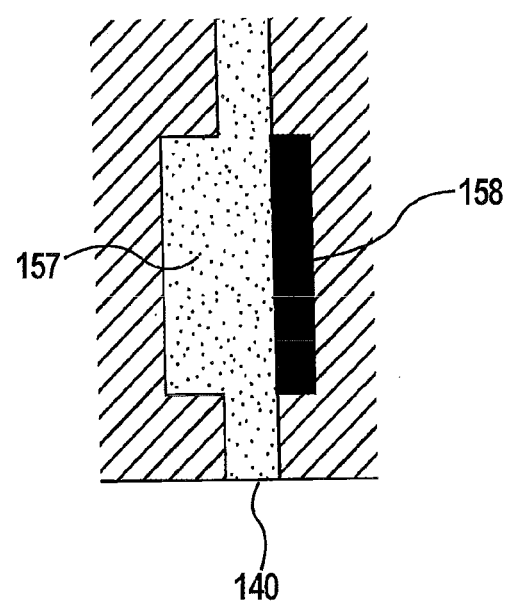
FIG. 23 is an enlarged view showing a liquid chamber and a piezoelectric element shown in FIG. 21.
Figure 24:
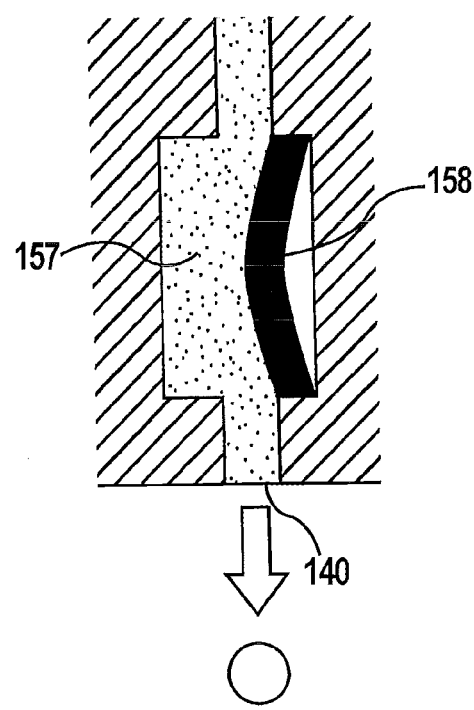
FIG. 24 is a view showing a state in which a voltage is applied to the piezoelectric element shown in FIG. 23.

FIG. 23 is an enlarged view showing the liquid chamber 157 and the piezoelectric element 158 shown in FIG. 21, and FIG. 24 is a view showing a state in which the voltage is applied to the piezoelectric element 158 shown in FIG. 23. The piezoelectric element 158 is in contact with the liquid in the liquid chamber 157. When the voltage is applied to the piezoelectric element 158, the piezoelectric element 158 becomes deformed as shown in FIG. 24. As a result, the liquid, filling the liquid chamber 157, is pushed out by the deformed piezoelectric element 158, and is discharged as a droplet through the liquid outlet 140.

The voltage is periodically applied to the piezoelectric element 158 to thereby cause the piezoelectric element 158 to continuously eject droplets into the mixing chamber 121. The droplets are broken up in the mixing chamber 121 by the gas flow, thereby forming finer droplets. Such fine droplets and the gas are mixed in the mixing chamber 121 to form the two-fluid jet. As shown in FIG. 19, the fine droplets, which constitute the two-fluid jet, enter the minute recesses (e.g., stepped portions of patterns and scratches) formed on the surface of the wafer, thus removing fine particles of at most 100 nm that exist in these recesses.

Figure 25:
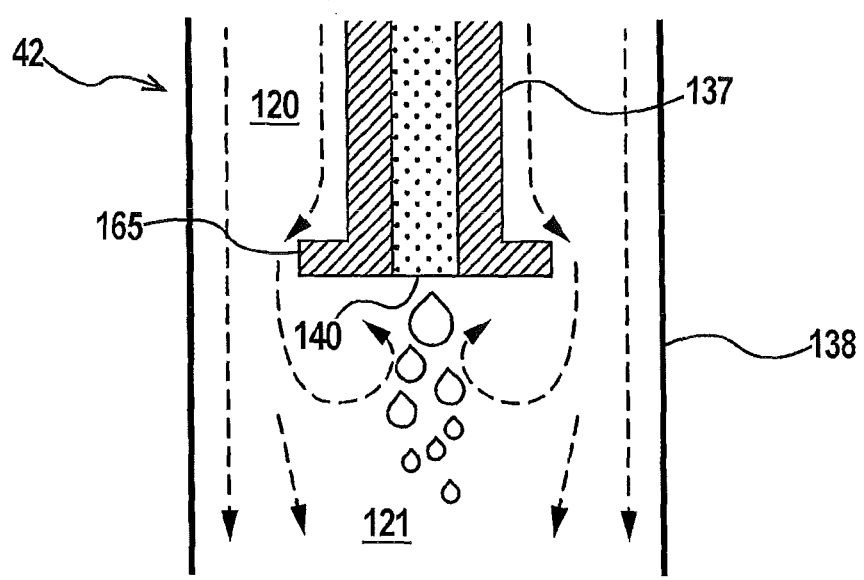
FIG. 25 is a view showing a flange formed on a lower end of a liquid delivery pipe.
Figure 26:
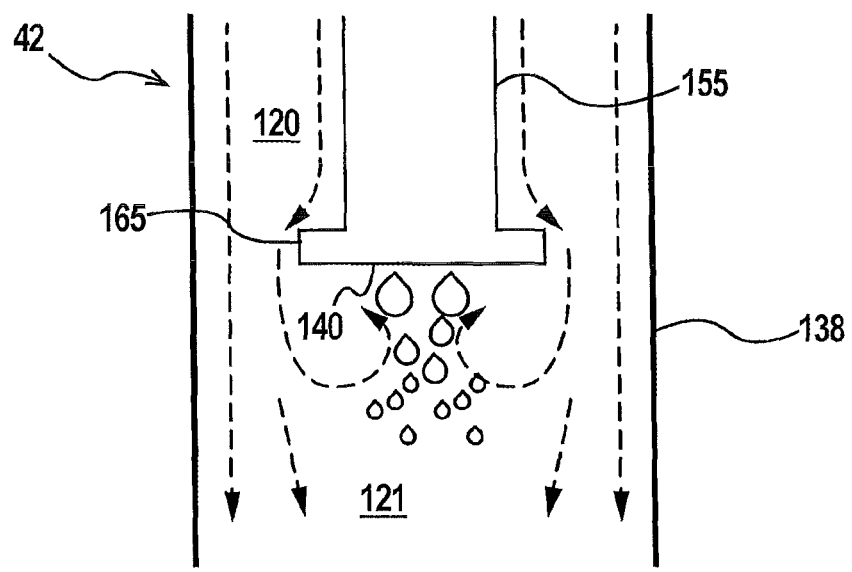
FIG. 26 is a view showing a flange formed on a lower end of the piezoelectric injector.

In the above-described embodiment, the droplets are supplied into the mixing chamber 121, and are converted into finer droplets by a collision with the gas flow. In order to accelerate the collision between the droplets and the gas flow, it is preferable to generate a turbulent flow of the gas in the mixing chamber 121. Specifically, as shown in FIG. 25 and FIG. 26, the droplet-forming device 150 may have a flange 165 that protrudes outwardly from the droplet outlet 140. In an example shown in FIG. 25, the flange 165 is formed on the lower end of the liquid delivery pipe 137. In an example shown in FIG. 26, the flange 165 is formed on a lower end of the piezoelectric injector 155.

The flange 165 is located in the gas pocket 120. When the gas flow travels over the flange 165, the gas flow is disturbed to form an inward vortex flow. Such a vortex flow collides with the droplets discharged from the droplet outlet 140, thereby converting the droplets into finer droplets. In order to generate a stronger vortex flow of the gas, the flow velocity of the gas is preferably not less than the speed of sound.

Figure 27:
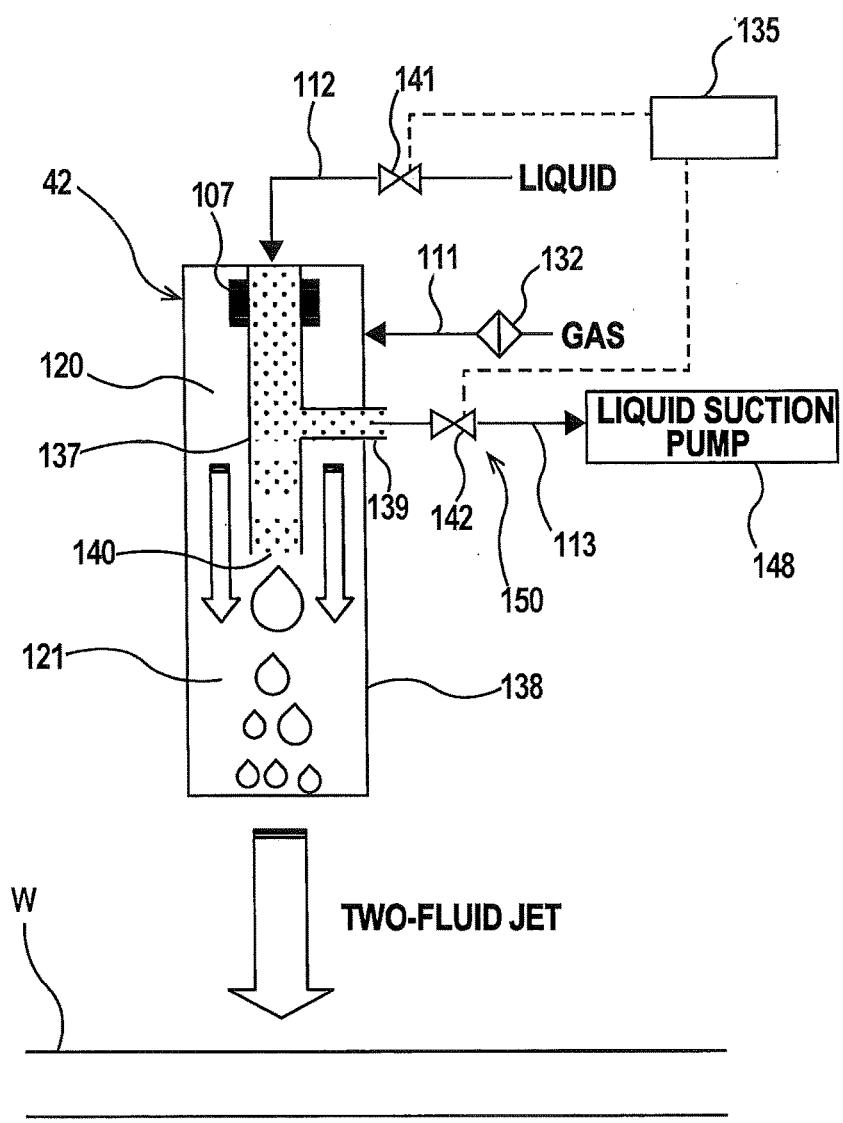
FIG. 27 is a view showing an ultrasonic transducer provided on the liquid delivery pipe.
Figure 28:
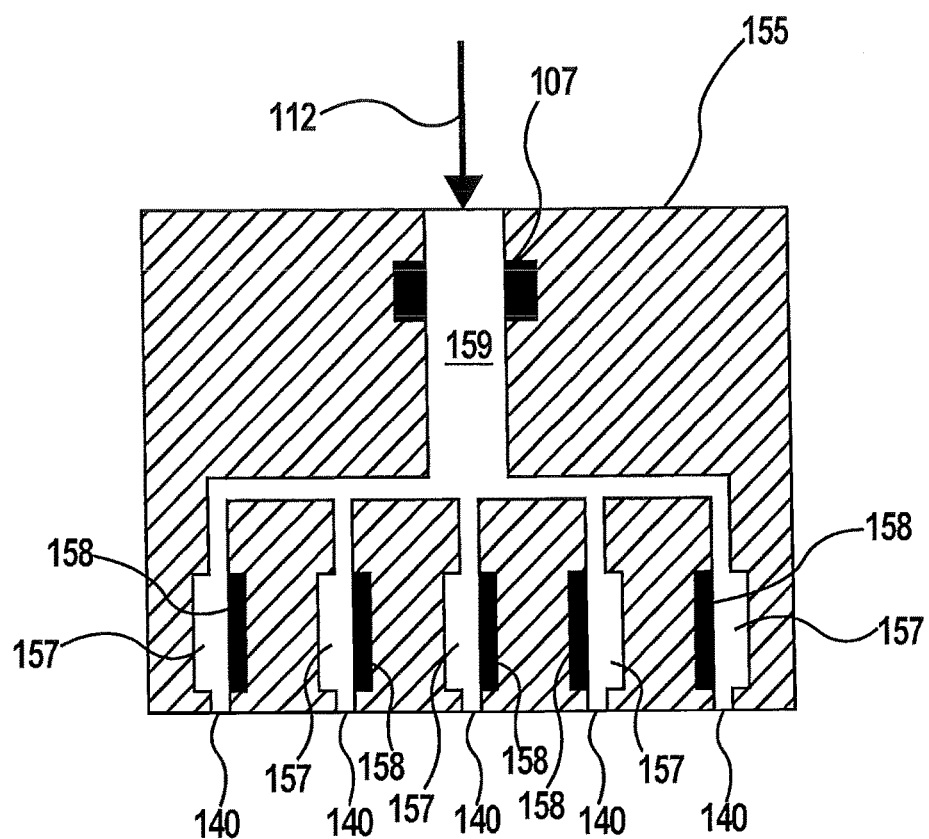
FIG. 28 is a view showing an ultrasonic transducer provided on a distribution passage in the piezoelectric injector.

In order to further enhance the cleaning performance of the two-fluid jet, an ultrasonic transducer 107 that vibrates the liquid before forming the droplets may be provided, as shown in FIG. 27 and FIG. 28. In an example shown in FIG. 27, the ultrasonic transducer 107 surrounds a part of the liquid delivery pipe 137. In an example shown in FIG. 28, the ultrasonic transducer 107 surrounds a part of the distribution passage 159 in the piezoelectric injector 155. The ultrasonic transducer 107 may be provided on the liquid supply line 112. A frequency of the vibration generated by the ultrasonic transducer 107 is preferably in a range of several tens of Hz to several MHz. Furthermore, a plurality of ultrasonic transducers 107, which can generate vibrations at different frequencies, may be provided along the liquid delivery pipe 137 or the distribution passage 159. By vibrating the liquid at the different frequencies, particles having different sizes can be removed from the wafer W. The ultrasonic transducer 107 can vibrate the droplets discharged from the droplet outlet 140, so that the particles can be removed from the wafer more effectively.

Figure 29:
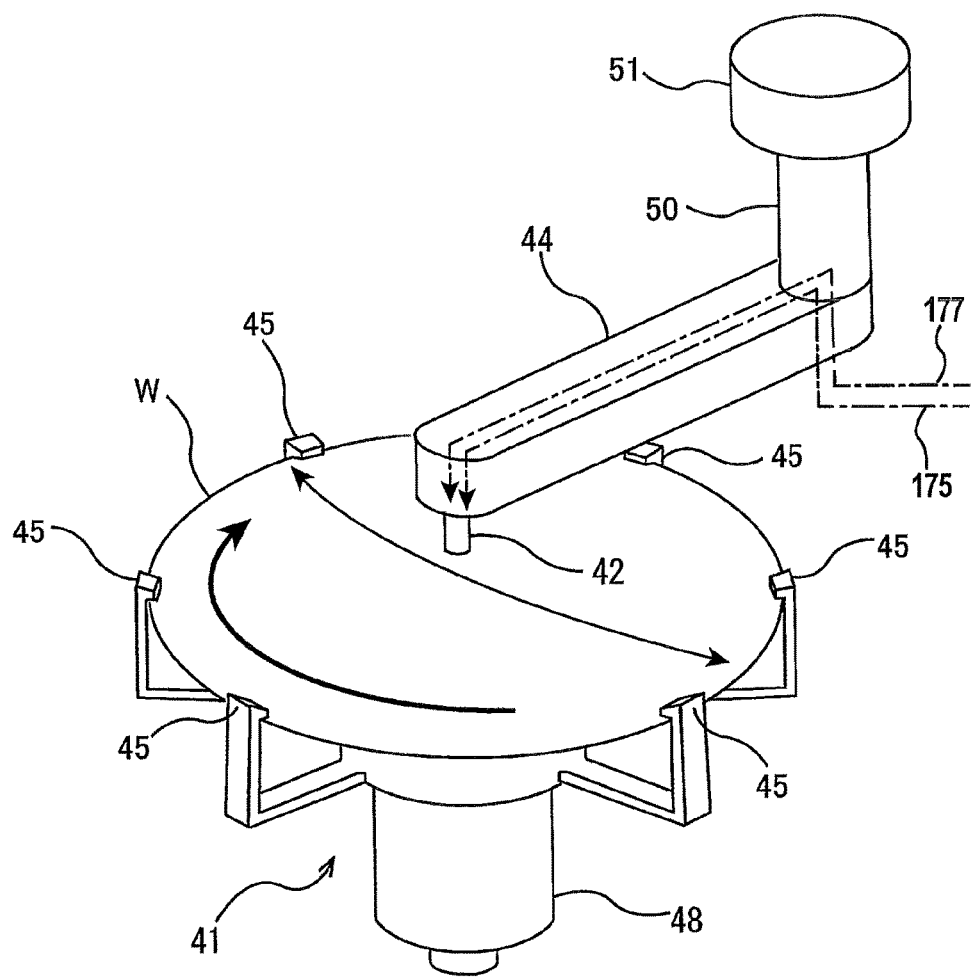
FIG. 29 is a perspective view showing still another embodiment of the substrate cleaning apparatus used as the second cleaning unit.

FIG. 29 is a perspective view showing still another embodiment of the substrate cleaning apparatus used as the second cleaning unit 18. Structures and operations of the substrate cleaning apparatus that are not described particularly in this embodiment are identical to those of the embodiment shown in FIG. 2, and repetitive descriptions thereof are omitted. As shown in FIG. 29, this substrate cleaning apparatus includes substrate holder 41 configured to hold and rotate a wafer W, which is an example of a substrate, two-fluid nozzle 42 configured to deliver a two-fluid jet onto an upper surface of the wafer W, and nozzle arm 44 that holds this two-fluid nozzle 42.

A gas supply line 175 and a liquid supply line 177 are coupled to the two-fluid nozzle 42. A gas and a liquid are supplied through the gas supply line 175 and the liquid supply line 177 to the two-fluid nozzle 42, and are mixed in the two-fluid nozzle 42 to form a two-fluid mixture. This two-fluid mixture is ejected from the two-fluid nozzle 42 onto the surface of the wafer W.

The substrate holder 41 includes a plurality of (e.g., six in FIG. 29) chucks 45 for holding a periphery of the wafer W, and a motor 48 coupled to the chucks 45. The chucks 45 hold the wafer W, and in this state, the wafer W is rotated about its central axis by the motor 48.

Figure 30:
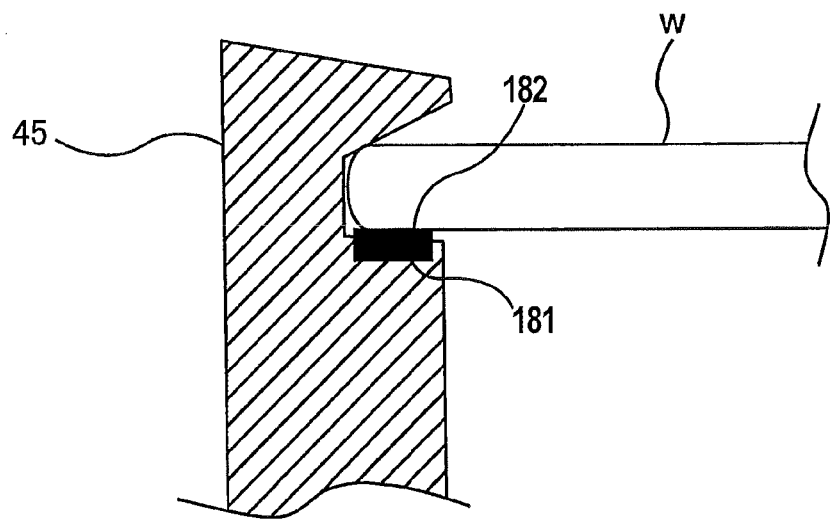
FIG. 30 is a cross-sectional view showing a chuck of the substrate cleaning apparatus.

FIG. 30 is an enlarged cross-sectional view of the chuck 45. As shown in FIG. 30, the chuck is provided with an oscillator 181 that is configured to vibrate the wafer W while being in contact with a periphery of the wafer W. The oscillator 181 has a contact surface 182 lying parallel to the surface of the wafer W. This contact surface 182 is to come in contact with a lower surface of the periphery of the wafer W when the wafer W is supported by the chucks 45. All chucks 45 are provided with oscillators 181, respectively, and these oscillators 181 are arranged along the periphery of the wafer W at equal intervals. When the chucks 45 are rotated by the motor 48, the oscillators 181 are rotated together with the chucks 45. Therefore, the oscillators 181 vibrate the wafer W while being rotated together with the wafer W.

Figure 31:
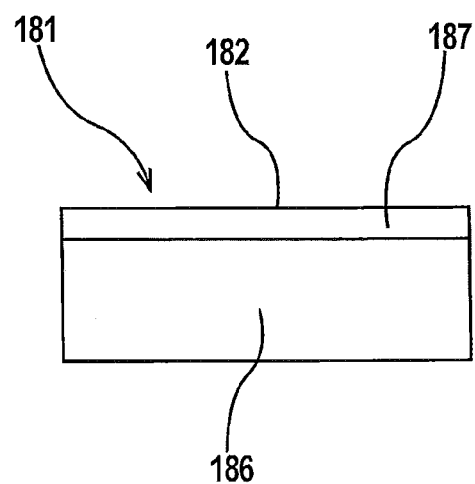
FIG. 31 is an enlarged view of an oscillator.

FIG. 31 is an enlarged view of the oscillator 181. As shown in FIG. 31, the oscillator 181 includes a piezoelectric element (or a piezo element) 186, and a contact member 187 mounted to the piezoelectric element 186. The oscillator 181 is disposed on the chuck 45 such that the contact member 187 comes in contact with the lower surface of the periphery of the wafer W. Therefore, a surface of the contact member 187 constitutes a contact surface 182 that is to come in contact with the lower surface of the periphery of the wafer W.

The contact member 187 serves to protect the piezoelectric element 186 from the liquid supplied to the wafer W and to protect the wafer W from the piezoelectric element 186. For example, the contact member 187 is a sheet member made of Teflon (registered trademark), PEEK (polyether ether ketone) resin, quartz, or the like. This contact member 187 may be omitted. In this case, the above-described contact surface 182 of the oscillator 181, which is to come in contact with the lower surface of the wafer W, is constituted by a surface of the piezoelectric element 186 itself.

As can be seen from FIG. 30, the oscillator 181 is in contact with the lower surface of the wafer W, and vibrates the wafer W in a direction perpendicular to the surface of the wafer W. A frequency and an amplitude of the vibration generated by the oscillator 181 can vary depending on a voltage applied to the piezoelectric element 186. The frequencies and/or the amplitudes of the vibrations generated by the oscillators 181 that are provided on the chucks 45, respectively, may be the same as or different from each other.

Figure 32:
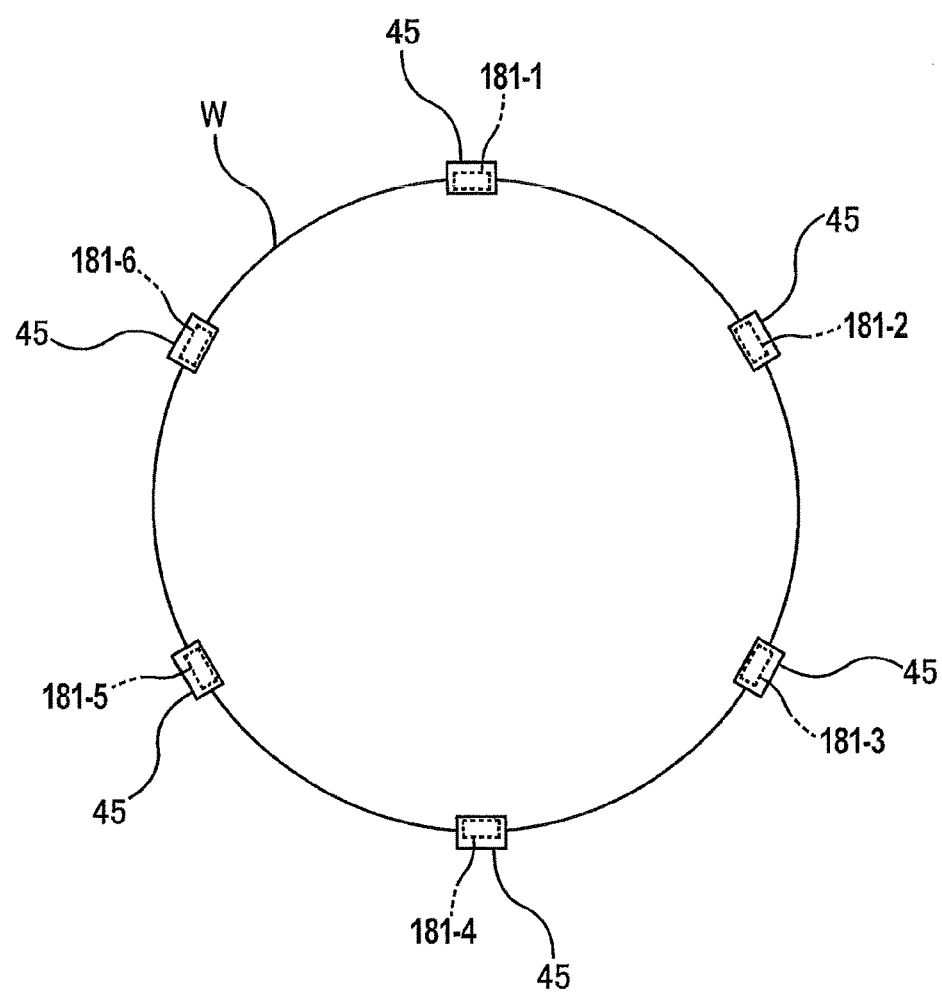
FIG. 32 is a plan view of a substrate holder.

At least two of all oscillators 181 may vibrate at different frequencies and/or different amplitudes. For example, a first group consisting of three oscillators 181-1, 181-3, 181-5 shown in FIG. 32 may vibrate at frequency of tens of kHz to hundreds of kHz, while a second group consisting of three oscillators 181-2, 181-4, 181-6, which are located between the oscillators belonging to the first group, may vibrate at frequency of 1 MHz. The amplitude of the vibration of the oscillators 181-1, 181-3, 181-5 belonging to the first group may be the same as or different from the amplitude of the vibration of the oscillators 181-2, 181-4, 181-6 belonging to the second group.

The wafer W is cleaned as follows. The wafer W is rotated about its central axis by the substrate holder 41 and is vibrated by the oscillators 181 at predetermined frequency and amplitude. In this state, the two-fluid nozzle 42 delivers the two-fluid jet onto the upper surface of the wafer W, while moving in the radial direction of the wafer W. The upper surface of the wafer W is cleaned by a combined action of the vibration applied by the oscillators 181 and the impact of the two-fluid jet.

Figure 33:
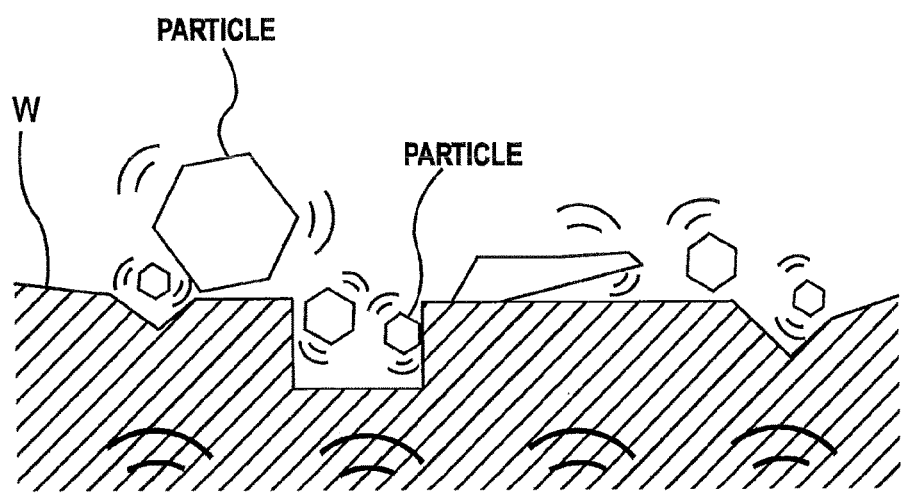
FIG. 33 is a schematic view showing a state in which the oscillator is vibrating the wafer.
Figure 34:
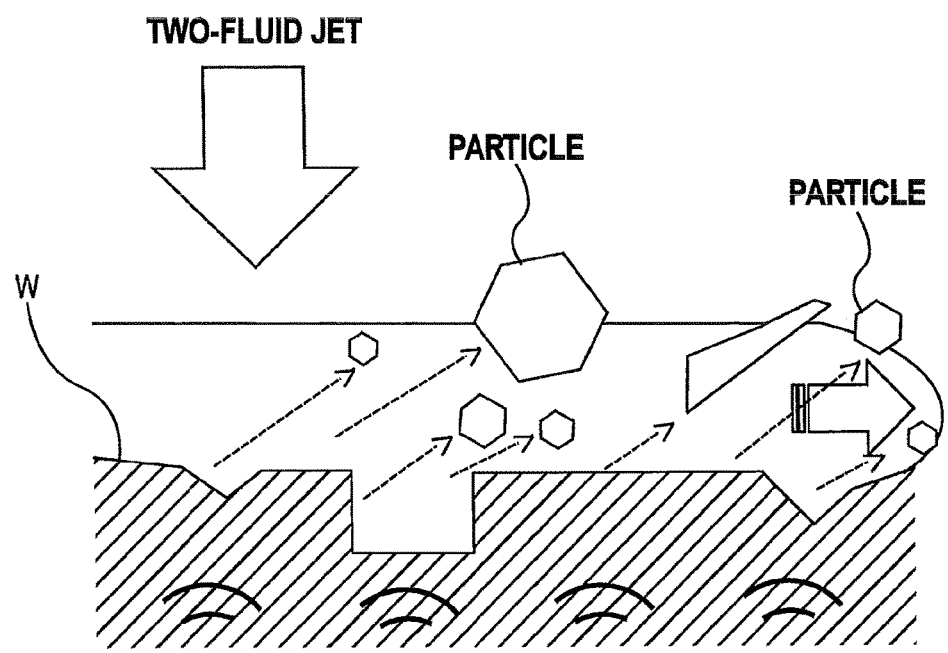
FIG. 34 is a schematic view showing a state in which the two-fluid jet is delivered onto the surface of the wafer while the oscillator is vibrating the wafer.

FIG. 33 is a schematic view showing a state in which the oscillators 181 are vibrating the wafer W, and FIG. 34 is a schematic view showing a state in which the two-fluid jet is delivered onto the surface of the wafer W while the oscillators 181 are vibrating the wafer W. As shown in FIG. 33, when the vibration is applied to the wafer W, the particles are likely to be separated from the wafer W. In this state, the two-fluid jet is supplied onto the wafer W, thereby removing the particles from the wafer W. In this manner, a cleaning efficiency of the wafer W can be improved by a combination of the vibration of the wafer W and the impact of the two-fluid jet.

The oscillator 181 does not indirectly vibrate the wafer W through the chuck 45, but directly vibrates the wafer W with its contact surface 182 in contact with the wafer W. Therefore, the chuck 45 itself hardly vibrates, and thus the chuck 45 can stably hold the wafer W. In other words, the oscillator 181 according to this embodiment can vibrate only the wafer W without vibrating the chuck 45.

Figure 35:
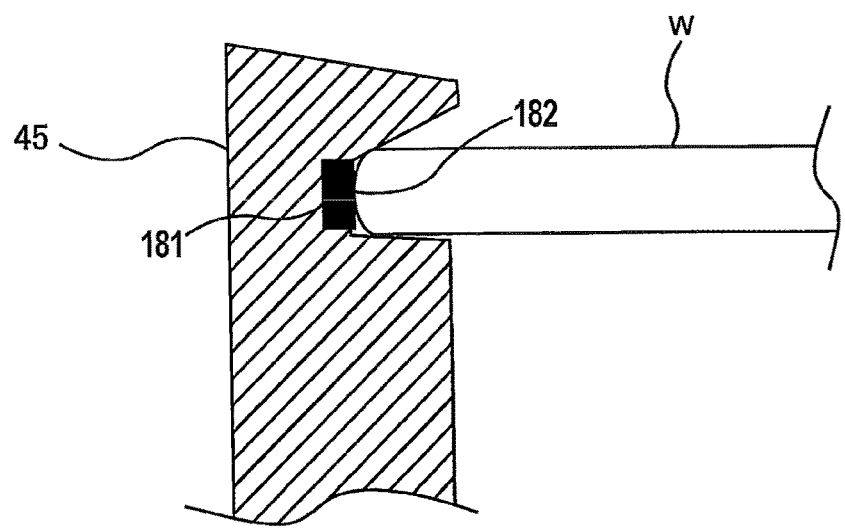
FIG. 35 is a view showing still another embodiment.

FIG. 35 is a view showing still another embodiment. In this embodiment, the oscillator 181 is located so as to come in contact with a circumferential surface (i.e., an outermost end surface) of the wafer W, and to vibrate the wafer W in a direction parallel to the surface of the wafer W. This oscillator 181 has a contact surface 182 that is to come in contact with the circumferential surface of the wafer W. The structure of the oscillator 181 is the same as that of the oscillator 181 shown in FIG. 31, and repetitive descriptions thereof are omitted. According to this embodiment, the oscillator 181 vibrates the wafer W in the direction parallel to the surface of the wafer W during cleaning of the wafer W with the two-fluid jet.

Figure 36:
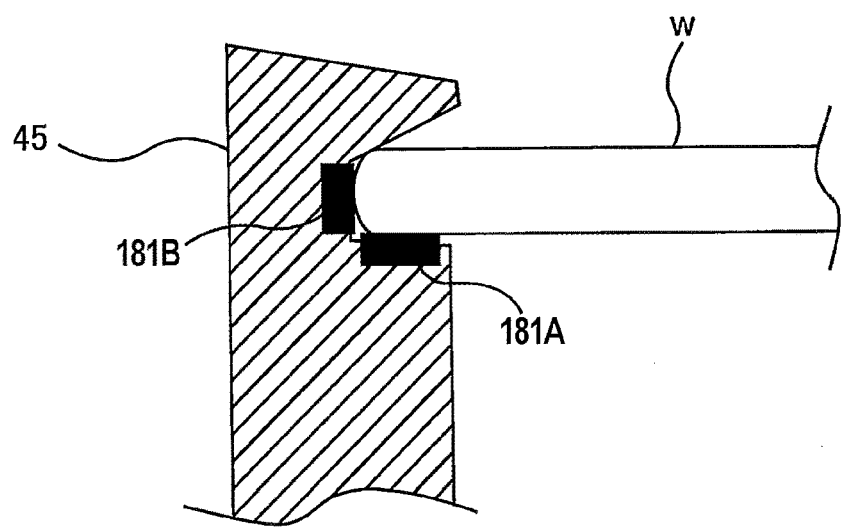
FIG. 36 is a view showing still another embodiment.

FIG. 36 is a view showing still another embodiment. In this embodiment, each one of chucks 45 is provided with two oscillators 181A, 181B. The first oscillator 181A has the same structure as that of the oscillator 181 shown in FIG. 30, and is disposed at the same location as that of the oscillator 181 shown in FIG. 30. More specifically, the first oscillator 181A is in contact with the lower surface of the peripheral of the wafer W to vibrate the wafer W in the direction perpendicular to the surface of the wafer W. The second oscillator 181B has the same structure as that of the oscillator 181 shown in FIG. 35, and is disposed at the same location as that of the oscillator 181 shown in FIG. 35. More specifically, the second oscillator 181B is in contact with the circumferential surface (i.e., the outermost end surface) of the wafer W to vibrate the wafer W in the direction parallel to the surface of the wafer W.

According to this embodiment, the second oscillator 181B vibrates the wafer W in the direction parallel to the surface of the wafer W, while the first oscillator 181A vibrates the wafer W in the direction perpendicular to the surface of the wafer W. Therefore, the particles are more likely to be separated from the wafer W. In this state, the two-fluid jet is supplied onto the wafer W to remove the particles from the wafer W. In this manner, the cleaning efficiency of the wafer W can be further improved by a combination of the vibration of the wafer W in two directions and the impact of the two-fluid jet. A frequency and/or an amplitude of the vibration of the first oscillator 181A may be the same as or may be different from a frequency and/or an amplitude of the vibration of the second oscillator 181B.

Figure 37:
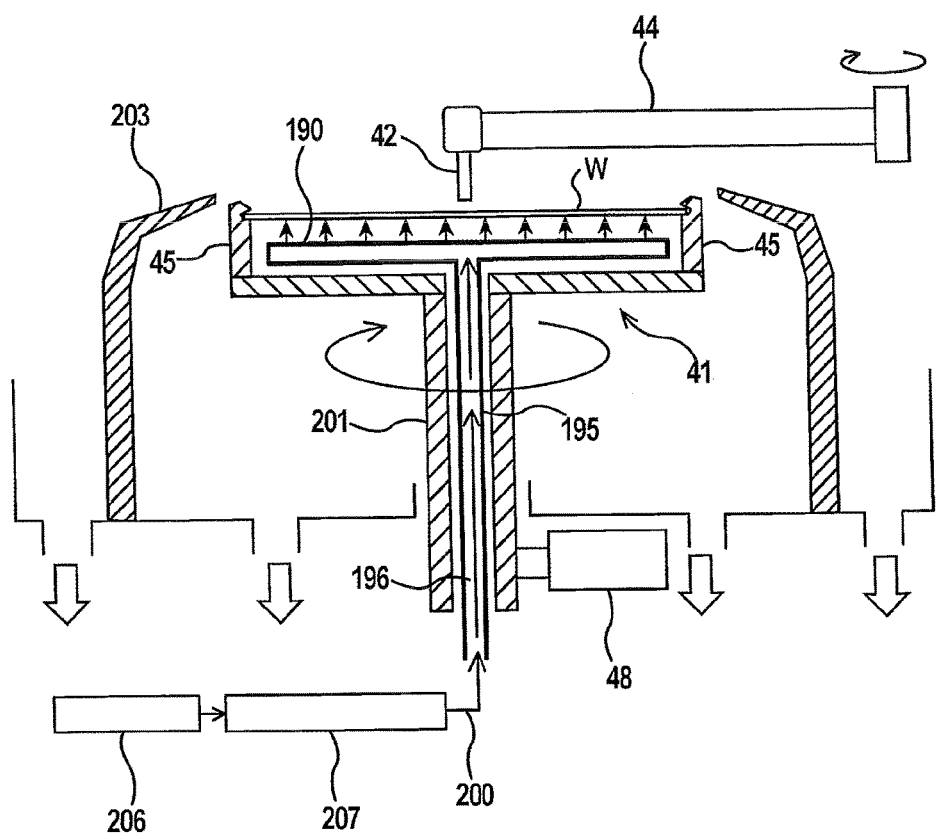
FIG. 37 is a view showing still another embodiment.

FIG. 37 is a view showing still another embodiment. Although not shown in FIG. 37, each of the chucks 45 shown in FIG. 37 is provided with the oscillator 181 shown in FIG. 30 and/or the oscillator 181 shown in FIG. 35. Structures and operations of this embodiment that are not described particularly are identical to those of the embodiment shown in FIG. 29, and repetitive descriptions thereof are omitted.

In this embodiment, a cleaning-liquid nozzle 190, which supplies a cleaning liquid onto the lower surface of the wafer W, is disposed below the wafer W held by the substrate holder 41. This cleaning-liquid nozzle 190 is secured to an upper end of a supporting shaft 195. A cleaning-liquid supply line 200 is coupled to a lower end of the supporting shaft 195. A rotational shaft 201, which couples the chucks 45 to the motor 48, is constituted by a hollow shaft, and the supporting shaft 195 extends through the rotational shaft 201. The rotational shaft 201 and the chucks 45 are rotated by the motor 48, while the supporting shaft 195 and the cleaning-liquid nozzle 190 are not rotated.

A liquid-receiving cup 203, which has a cylindrical shape, is provided around the wafer W held by the substrate holder 41. This liquid-receiving cup 203 serves to receive the liquid that has been supplied to the rotating wafer W and then direct the liquid downwardly. This liquid-receiving cup 203 may be provided in the substrate cleaning apparatus according to the above-described embodiment shown in FIG. 29.

A passage 196 is formed in the supporting shaft 195. The cleaning-liquid supply line 200 supplies the cleaning liquid into the passage 196 of the supporting shaft 195. The cleaning-liquid supply line 200 is provided with a cleaning-liquid supply source 206 and a gas-mixing device 207. The gas-mixing device 207 is a device configured to mix a gas, such as nitrogen gas or hydrogen gas, into the cleaning liquid supplied from the cleaning-liquid supply source 206. The cleaning liquid containing such a dissolved gas passes through the cleaning-liquid supply line 200 and the passage 196 and is supplied to the cleaning-liquid nozzle 190. The cleaning liquid may be pure water.

Figure 38:
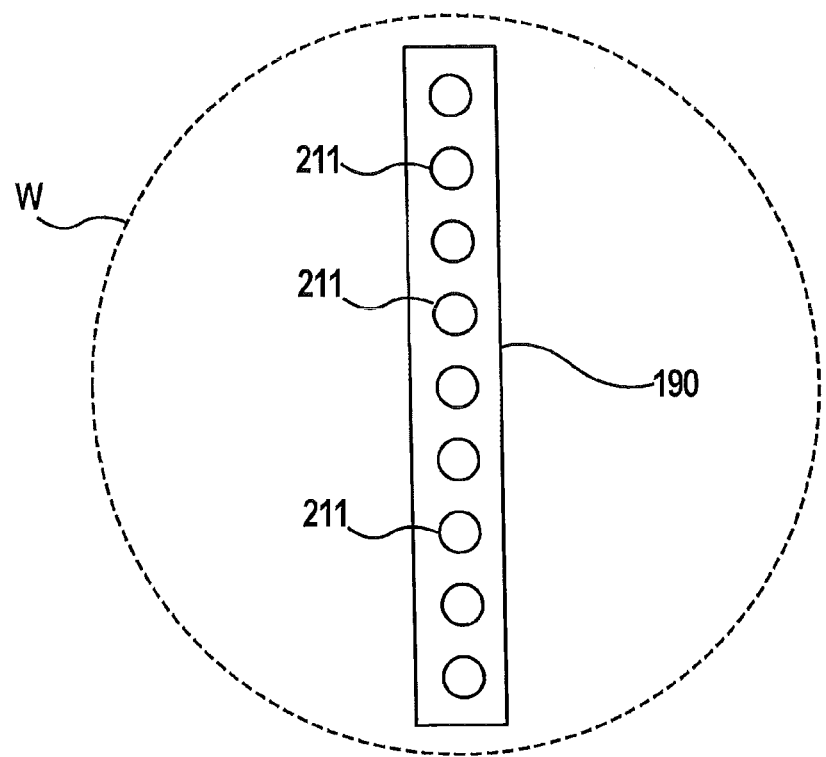
FIG. 38 is a plan view of a cleaning-liquid nozzle.
Figure 39:
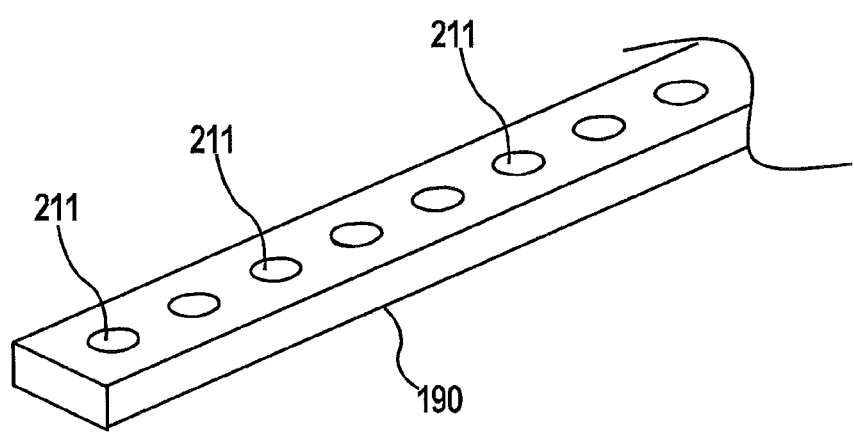
FIG. 39 is a perspective view of the cleaning-liquid nozzle.
Figure 40:
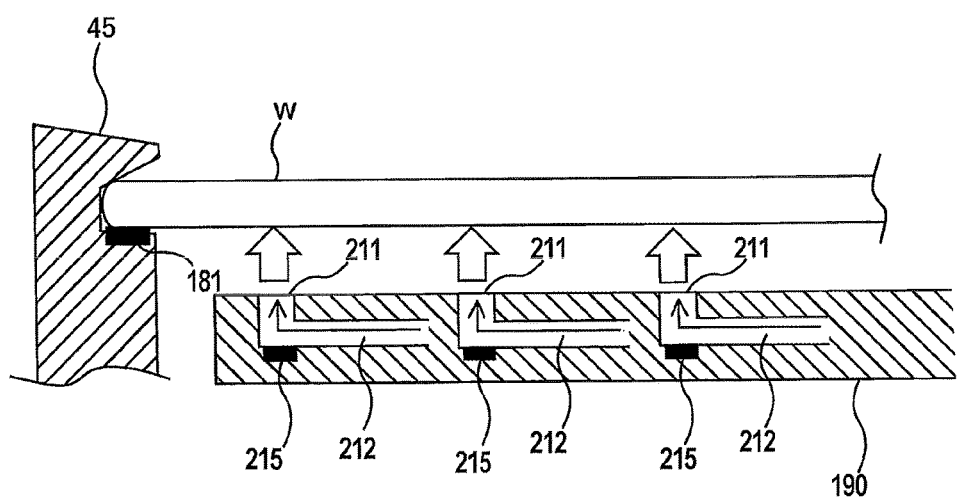
FIG. 40 is an enlarged cross-sectional view of the cleaning-liquid nozzle.

FIG. 38 is a plan view of the cleaning-liquid nozzle 190, FIG. 39 is a perspective view of the cleaning-liquid nozzle 190, and FIG. 40 is an enlarged cross-sectional view of the cleaning-liquid nozzle 190. The cleaning-liquid nozzle 190 extends in a diametrical direction of the wafer W. As shown in FIG. 40, the cleaning-liquid nozzle 190 has a plurality of ejection mouths 211, and a plurality of passages 212 which are in communication with these ejection mouths 211, respectively. A plurality of ultrasonic transducers 215 are embedded in the cleaning-liquid nozzle 190, and are located so as to come in contact with the cleaning liquid flowing in the passages 212, respectively, to vibrate the cleaning liquid. The cleaning liquid, to which the vibration energy has been transmitted, passes through the plurality of passages 212 and is then supplied from the ejection mouths 212 onto the lower surface of the wafer W. A distance from the ejection mouths 211 to the lower surface of the wafer W is preferably not more than 10 mm, and more preferably not more than 5 mm.

Each of the ultrasonic transducers 215 is disposed below each of the ejection mouths 211, and is configured to vibrate the cleaning liquid immediately before the cleaning liquid is supplied onto the wafer W. When the ultrasonic transducer 215 vibrates the cleaning liquid, the gas that has been dissolved in the cleaning liquid forms bubbles, which can improve the cleaning effect of the cleaning liquid.

Cleaning of the wafer W is performed as follows. The wafer W is rotated about its central axis by the substrate holder 41 and is vibrated by the oscillators 181 at predetermined frequency and amplitude. Further, the cleaning liquid is supplied onto the lower surface of the wafer W while the cleaning liquid is vibrated by the ultrasonic transducers 215. In this state, the two-fluid nozzle 42 supplies the two-fluid jet onto the upper surface of the wafer W, while moving in the radial direction of the wafer W. The upper surface of the wafer W is cleaned by the combined action of the vibration applied by the oscillators 181 and the impact of the two-fluid jet, while the lower surface of the wafer W is cleaned with the cleaning liquid on which the vibration energy has been exerted.

Figure 41:
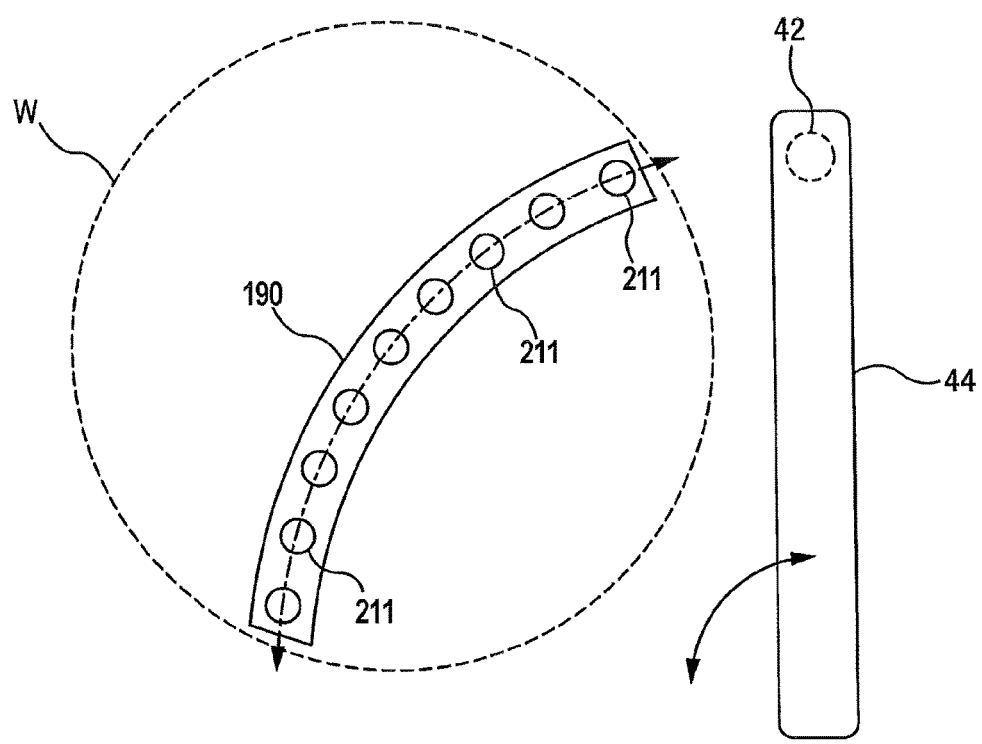
FIG. 41 is a plan view of the cleaning-liquid nozzle according to another example.
Figure 42:
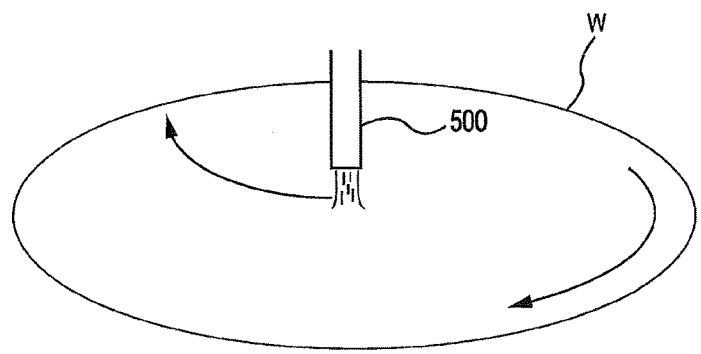
FIG. 42 is a schematic view showing a conventional two-fluid cleaning apparatus.
Figure 43:
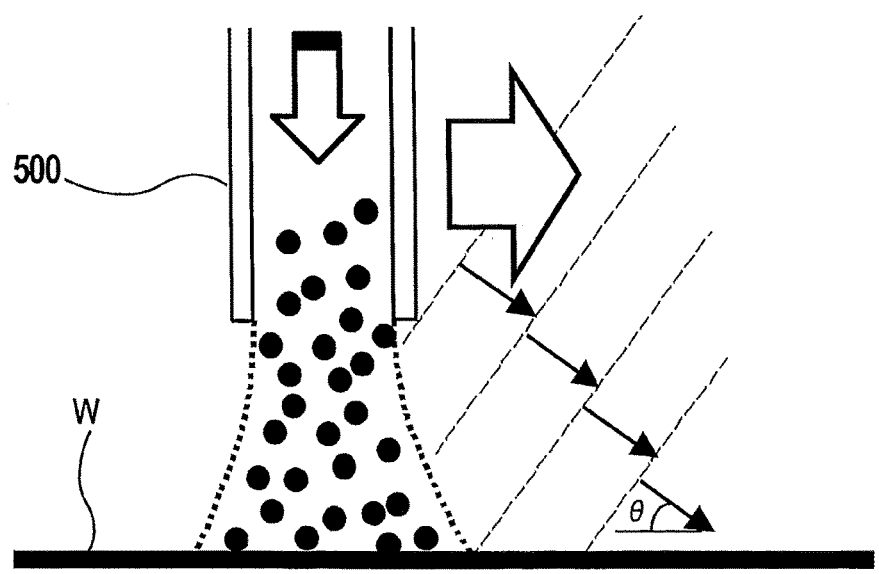
FIG. 43 is a schematic view showing a two-fluid jet ejected from a conventional jet nozzle.
Figure 44:
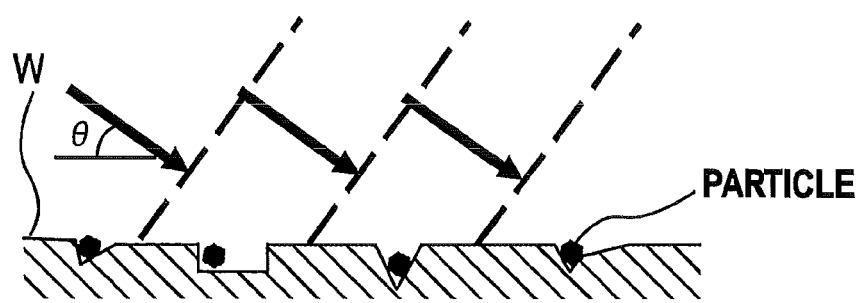
FIG. 44 is a schematic view showing shock waves when the two-fluid jet collides with a surface of a substrate.
Figure 45:
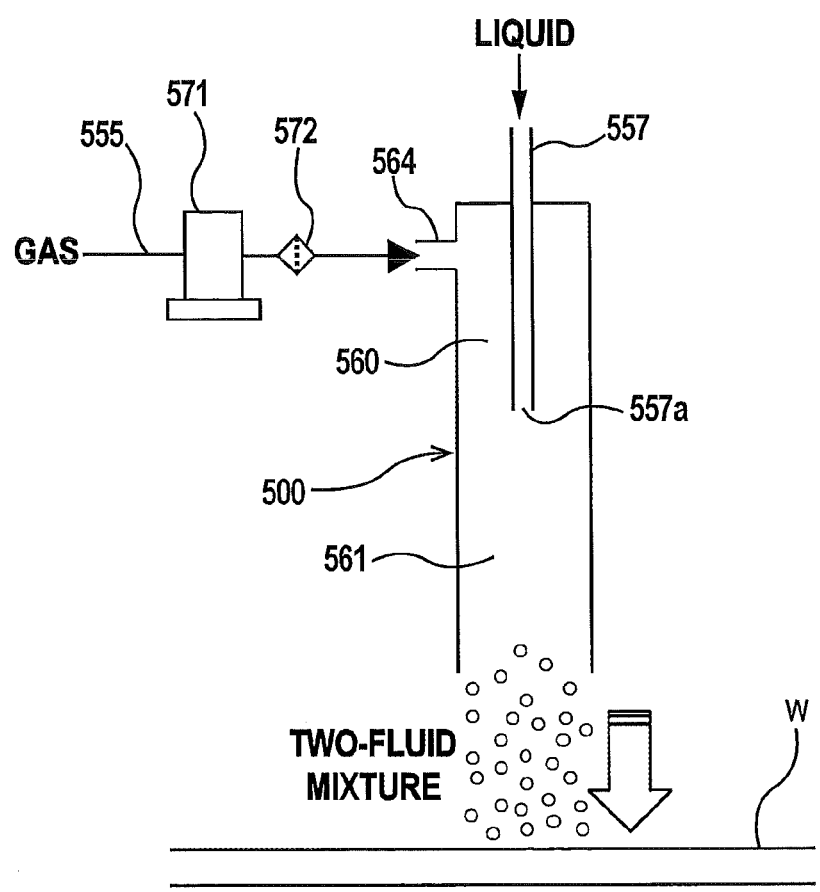
FIG. 45 is a schematic view showing a structure of the two-fluid cleaning apparatus shown in FIG. 42.
Figure 46:
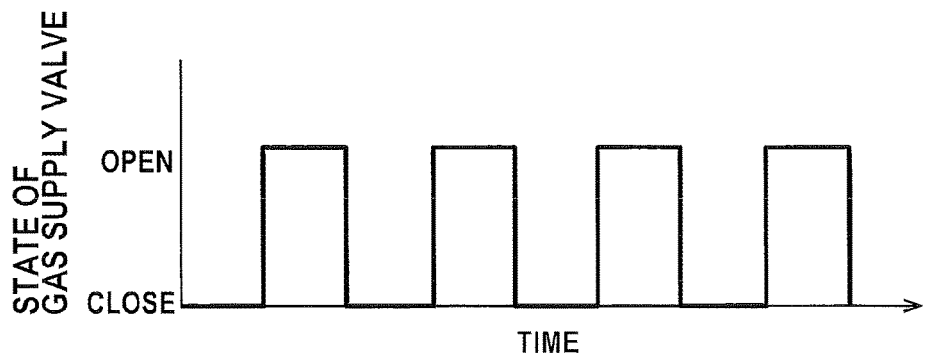
FIG. 46 is a graph a showing open and closed states of a gas supply valve.
Figure 47:
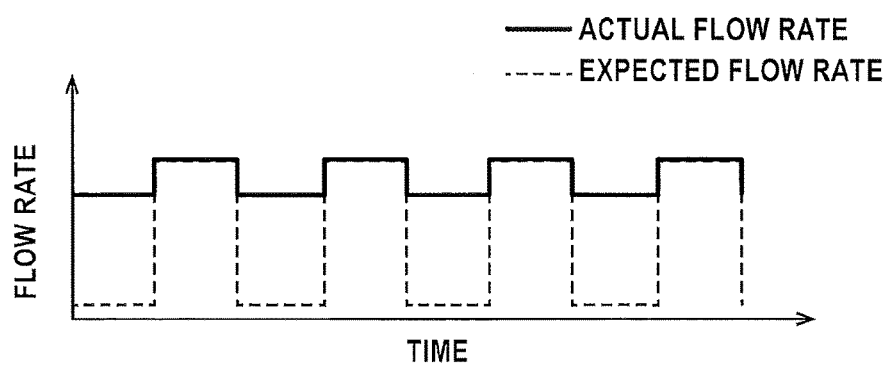
FIG. 47 is a graph showing a flow rate of a two-fluid mixture when the gas supply valve is periodically opened and closed according to timings shown in FIG. 46.
Figure 48:
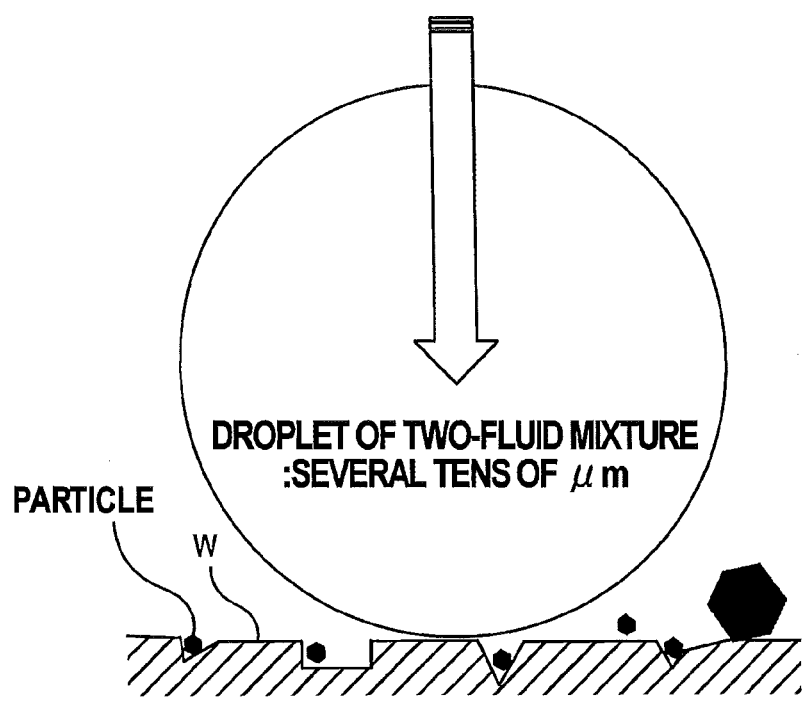
FIG. 48 is a schematic view showing a droplet of the two-fluid mixture.
Figure 49:
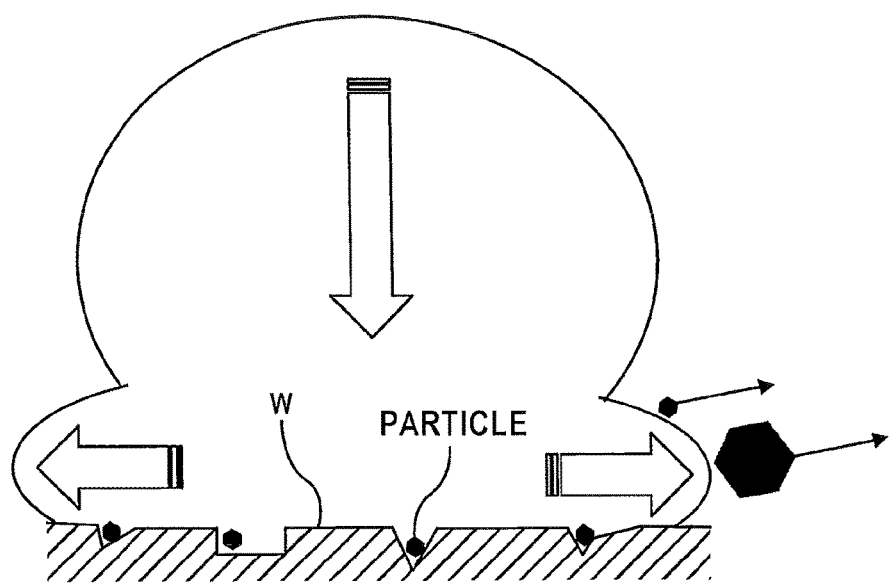
FIG. 49 is a schematic view showing the droplet when colliding with the surface of the substrate.

The ejection mouths 211 of the cleaning-liquid nozzle 190, which are disposed below the lower surface of the wafer W, may be arranged along a movement path of the two-fluid nozzle 42 that is disposed above the upper surface of the wafer W. For example, as shown in FIG. 41, the cleaning-liquid nozzle 190 may be in a shape of a circular arc extending along an arcuate movement path of the two-fluid nozzle 42.

In the embodiments shown in FIGS. 38 through 41, the two-fluid nozzle 42 is used, while a pen sponge can be used instead of the two-fluid nozzle 42.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:
1. A substrate cleaning apparatus comprising:
a substrate holder configured to hold a substrate; and
a two-fluid nozzle configured to deliver fluid onto a surface of the substrate,
wherein the two-fluid nozzle includes:
a liquid container having a liquid chamber and a chamber inlet in communication with the liquid chamber,
a first jet nozzle in communication with the liquid chamber and having a first gas inlet, the first jet nozzle being configured to emit a first two-fluid jet, the first two-fluid jet comprising a gas from the first gas inlet and a liquid from the liquid container, and a second jet nozzle in communication with the liquid chamber and having a second gas inlet, the second jet nozzle being configured to emit a second two-fluid jet at a velocity higher than a velocity of the first two-fluid jet, the second two-fluid jet comprising a gas from the second gas inlet and the liquid from the liquid container the second jet nozzle surrounding the first jet nozzle.

2. The substrate cleaning apparatus according to claim 1, wherein the velocity of the second two-fluid jet is not less than a speed of sound.

3. The substrate cleaning apparatus according to claim 1, further comprising:
a nozzle moving mechanism configured to move the two-fluid nozzle in a radial direction of the substrate.

4. The substrate cleaning apparatus according to claim 1, further comprising:
a distance adjuster configured to change a distance between the two-fluid nozzle and the surface of the substrate.

5. The substrate cleaning apparatus according to claim 1, further comprising:
a third jet nozzle disposed inside the first jet nozzle and configured to emit a third two-fluid jet at a velocity higher than the velocity of the first two-fluid jet.

6. The substrate cleaning apparatus according to claim 5, wherein the velocity of the third two-fluid jet is not less than a speed of sound.

7. The substrate processing apparatus according to claim 1, further comprising a polishing unit configured to polish the substrate.

8. The substrate processing apparatus according to claim 1, further comprising at least one oscillator that is to come in contact with the substrate to vibrate the substrate.

9. The substrate cleaning apparatus according to claim 8, wherein the oscillator is configured to rotate together with the substrate while vibrating the substrate.

10. The substrate cleaning apparatus according to claim 8, wherein the oscillator includes a piezoelectric element, and a contact member that is mounted to the piezoelectric element and is to come in contact with the substrate.

11. The substrate cleaning apparatus according to claim 8, wherein the oscillator is configured to vibrate the substrate in a direction perpendicular to the surface of the substrate.

12. The substrate cleaning apparatus according to claim 8, wherein the oscillator is configured to vibrate the substrate in a direction parallel to the surface of the substrate.

13. The substrate cleaning apparatus according to claim 8, wherein the at least one oscillator comprises at least one first oscillator configured to vibrate the substrate in a direction perpendicular to the surface of the substrate and at least one second oscillator configured to vibrate the substrate in a direction parallel to the surface of the substrate.

14. The substrate cleaning apparatus according to claim 8, wherein the at least one oscillator comprises a plurality of oscillators, and at least two of the plurality of oscillators are configured to vibrate the substrate at different frequencies and/or different amplitudes.

15. The substrate cleaning apparatus according to claim 8, further comprising:
a cleaning-liquid nozzle configured to supply a cleaning liquid onto a lower surface of the substrate; and
an ultrasonic transducer configured to vibrate the cleaning liquid.

16. The substrate processing apparatus according to claim 8, further comprising a polishing unit configured to polish the substrate.

17. The substrate cleaning apparatus according to claim 1, wherein:
the first jet nozzle receives liquid from the liquid chamber via first liquid inlet, and
the second jet nozzle receives liquid from the liquid chamber via a second liquid inlet.

18. The substrate cleaning apparatus according to claim 17, wherein the first jet nozzle extends through the liquid chamber and the first liquid inlet is in direct fluid communication with the liquid chamber.

19. A substrate cleaning apparatus comprising:
a substrate holder configured to hold a substrate; and
a two-fluid nozzle configured to deliver fluid onto a surface of the substrate,
wherein the two-fluid nozzle includes:
a liquid container having a liquid chamber and a chamber inlet in communication with the liquid chamber,
a first jet nozzle in communication with the liquid chamber and having a first gas inlet, the first jet nozzle being configured to emit a two-fluid jet, the two-fluid jet comprising a gas from the first gas inlet and a liquid from the liquid container, and
a second jet nozzle having a second gas inlet, the second jet nozzle being configured to emit a gas jet at a velocity higher than a velocity of the two-fluid jet, the gas jet comprising a gas from the second gas inlet the second jet nozzle surrounding the first jet nozzle.

20. The substrate processing apparatus according to claim 19, further comprising a polishing unit configured to polish the substrate.

21. The substrate cleaning apparatus according to claim 19, wherein the first jet nozzle receives liquid from the liquid chamber via a first liquid inlet.

22. A two-fluid nozzle for use in a substrate cleaning apparatus, comprising:
a liquid container having a liquid chamber and a chamber inlet which are in communication with each other;
a first jet nozzle in communication with the liquid chamber and having a first gas inlet, the first jet nozzle being configured to emit a first two-fluid jet, the first two-fluid jet comprising a gas from the first gas inlet and a liquid from the liquid container; and
a second jet nozzle in communication with the liquid chamber and having a second gas inlet, the second jet nozzle being configured to emit a second two-fluid jet, the second two-fluid jet comprising a gas from the second gas inlet and the liquid from the liquid container, and the second jet nozzle surrounding the first jet nozzle.

23. The two-fluid nozzle according to claim 22, further comprising:
a third jet nozzle disposed inside the first jet nozzle.

24. The substrate cleaning apparatus according to claim 22, wherein:
the first jet nozzle receives liquid from the liquid chamber via a first liquid inlet, and
the second jet nozzle receives liquid from the liquid chamber via a second liquid inlet.

25. The substrate cleaning apparatus according to claim 24, wherein the first jet nozzle extends through the liquid chamber and the first liquid inlet is in direct fluid communication with the liquid chamber.

* * * * *

UNITED STATES PATENT AND TRADEMARK OFFICE
CERTIFICATE OF CORRECTION

PATENT NO. : 10,090,189 B2
APPLICATION NO. : 14/541488
DATED : October 2, 2018
INVENTOR(S) : Tomoatsu Ishibashi Page 1 of 1

It is certified that error appears in the above-identified patent and that said Letters Patent is hereby corrected as shown below:

In the Claims

Column 21, Line 7 (Claim 1), "liquid container the second jet nozzle surrounding" should read --liquid container, the second jet nozzle surrounding--

Column 22, Line 4 (Claim 17), "via first liquid inlet, and" should read --"via a first liquid inlet, and--

Column 22, Line 28 (Claim 19), "inlet the second jet nozzle surrounding the first jet" should read --inlet, the second jet nozzle surrounding the first jet--

Column 22, Lines 50-51 (Claim 22), "containerm" should read --container--

Column 22, Line 56 (Claim 24), "24. The substrate cleaning apparatus according to claim" should read --The two-fluid nozzle according to claim--

Column 22, Line 62 (Claim 25), "25. The substrate cleaning apparatus according to claim" should read --The two-fluid nozzle according to claim--

Signed and Sealed this
Twenty-fifth Day of December, 2018

Andrei Iancu
*Director of the United States Patent and Trademark Office*